(12) United States Patent
Hung et al.

(10) Patent No.: US 11,990,385 B2
(45) Date of Patent: May 21, 2024

(54) ELECTRONIC DEVICE

(71) Applicant: Advanced Semiconductor Engineering, Inc., Kaohsiung (TW)

(72) Inventors: Li-Chieh Hung, Kaohsiung (TW); Hung-Chun Kuo, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 163 days.

(21) Appl. No.: 17/681,694

(22) Filed: Feb. 25, 2022

(65) Prior Publication Data

US 2023/0275000 A1    Aug. 31, 2023

(51) Int. Cl.
| | |
|---|---|
| *H01L 23/367* | (2006.01) |
| *H01L 23/48* | (2006.01) |
| *H01L 23/50* | (2006.01) |
| *H01L 23/538* | (2006.01) |
| *H01L 25/18* | (2023.01) |
| *H01L 23/00* | (2006.01) |

(52) U.S. Cl.
CPC ........ *H01L 23/3677* (2013.01); *H01L 23/481* (2013.01); *H01L 23/50* (2013.01); *H01L 23/5385* (2013.01); *H01L 23/5387* (2013.01); *H01L 25/18* (2013.01); *H01L 24/16* (2013.01); *H01L 24/17* (2013.01); *H01L 2224/16225* (2013.01); *H01L 2224/16245* (2013.01); *H01L 2224/17181* (2013.01)

(58) Field of Classification Search
CPC ............... H01L 23/3677; H01L 23/481; H01L 23/5385; H01L 23/5387; H01L 25/18; H01L 24/16; H01L 24/17; H01L 2224/16225; H01L 2224/16245; H01L 2224/17181
See application file for complete search history.

(56) References Cited

U.S. PATENT DOCUMENTS

| | | | |
|---|---|---|---|
| 10,529,677 B2 | 1/2020 | Yudanov | |
| 2009/0296360 A1* | 12/2009 | Doblar | ................. H05K 7/1061 |
| | | | 361/767 |
| 2014/0225248 A1* | 8/2014 | Henderson | .......... H01L 23/5383 |
| | | | 438/122 |
| 2014/0321062 A1* | 10/2014 | Ng | ....................... H05K 1/0216 |
| | | | 165/185 |

* cited by examiner

*Primary Examiner* — Peniel M Gumedzoe
(74) *Attorney, Agent, or Firm* — FOLEY & LARDNER

(57) ABSTRACT

An electronic device is provided. The electronic device includes an electronic component and a heat dissipation structure. The electronic component has a passive surface and a plurality of conductive vias exposed from the passive surface. The heat dissipation structure is disposed on the passive surface and configured to transmit a plurality of independent powers to the conductive vias through the passive surface.

8 Claims, 22 Drawing Sheets

ELECTRONIC DEVICE

BACKGROUND

1. Technical Field

The present disclosure relates generally to an electronic device.

2. Description of the Related Art

System-in-Package (SiP) technology leverages integrated circuit (IC) assembly capabilities, including wafer level packaging, fan-out wafer level packaging, 2.5D/3D IC, etc., to integrate multiple chips or components into a package.

A power path is usually provided by a substrate in the package. A long power routing path through the substrate may cause significant voltage drops and degrade performance thereof. As input voltage decreases, voltage drops may increasingly become an issue.

SUMMARY

In some embodiments, an electronic device includes an electronic component and a heat dissipation structure. The electronic component has a passive surface and a plurality of conductive vias exposed from the passive surface. The heat dissipation structure is disposed on the passive surface and configured to transmit a plurality of independent powers to the conductive vias through the passive surface.

In some embodiments, an electronic device includes an electronic component and a heat dissipation structure. The electronic component has a passive surface. The heat dissipation structure includes a plurality of conductive elements physically separated from each other. The electronic component and the respective conductive elements are configured to provide a plurality of power paths passing through the passive surface.

In some embodiments, an electronic device includes an electronic component, a heat dissipation structure, and a power regulating component. The electronic component has a passive surface. The heat dissipation structure is disposed on the passive surface of the electronic component and configured to provide power to the electronic component. The power regulating component is configured to receive a first power not through the heat dissipation structure and to provide a plurality of power paths between the heat dissipation structure and the power regulating component.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

DETAILED DESCRIPTION

Figure 1:
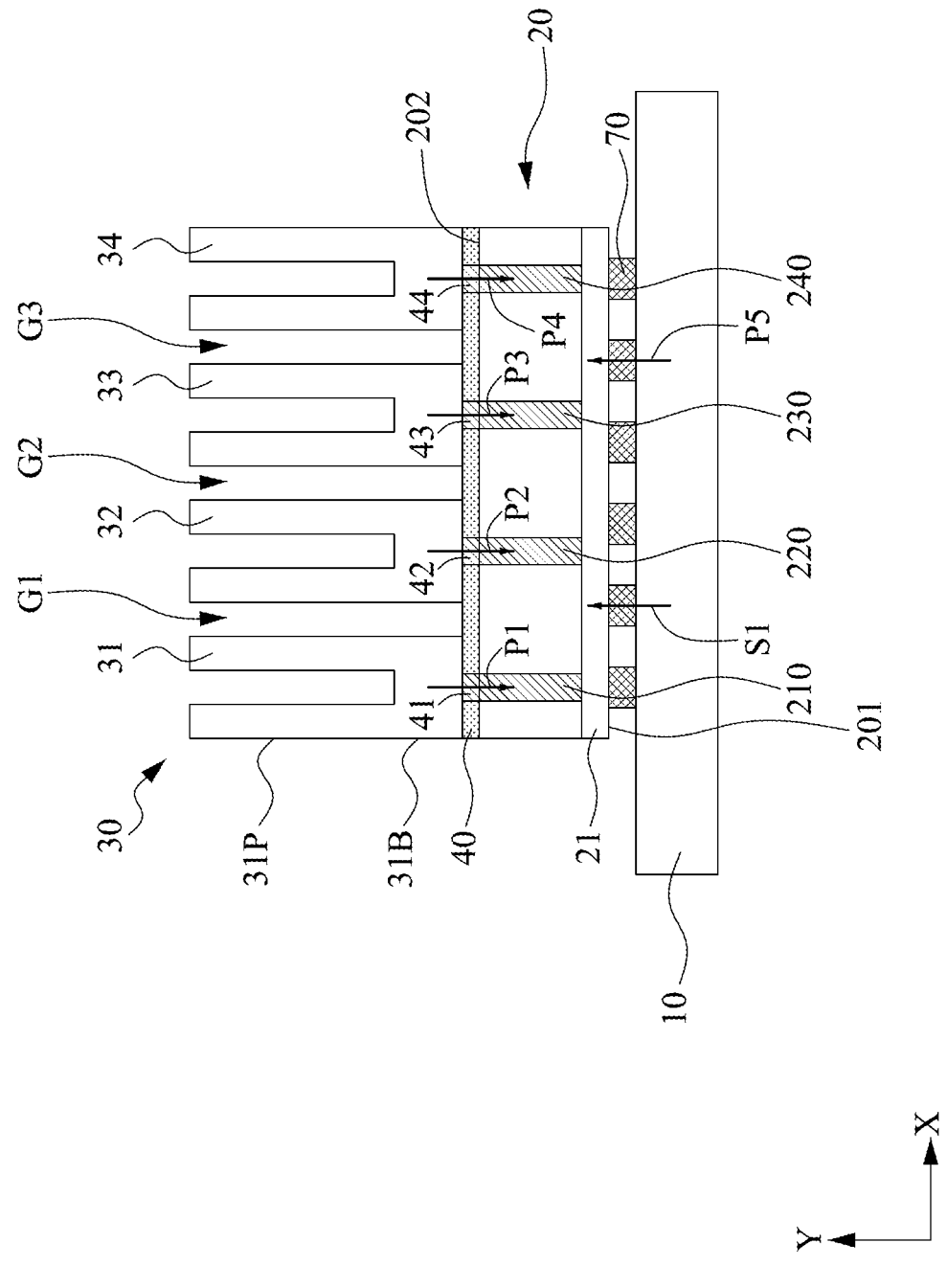
FIG. 1 is a cross-section of an electronic device in accordance with some embodiments of the present disclosure.

FIG. 1 is a cross-section of an electronic device 1 in accordance with some embodiments of the present disclosure. The electronic device 1 includes a substrate 10, an electronic component 20, a heat dissipation structure 30, a thermal dissipation layer 40, and connection elements 70.

The substrate 10 may include, for example, a printed circuit board, such as a paper-based copper foil laminate, a composite copper foil laminate, or a polymer-impregnated glass-fiber-based copper foil laminate. The substrate 10 may include a multilayer substrate which includes a core layer and one or more conductive materials and/or structures disposed on an upper surface and a bottom surface of the substrate 10. The substrate 10 may include an interconnection structure, such as a plurality of conductive traces and/or a plurality of through vias. For example, the substrate 10 may include a redistribution layer (RDL) and/or a grounding element. In some embodiments, the substrate 10 includes a ceramic material or a metal plate. In some embodiments, the substrate 10 may include an organic substrate or a leadframe.

In some embodiments, the substrate 10 supports and electrically connects to the electronic component 20. In some embodiments, the substrate 10 is disposed adjacent to the electronic component 20 and configured to transmit a signal (or an electrical signal) to the electronic component 20 and/or receive a signal (or an electrical signal) from the electronic component 20 through a signal path S1 between the substrate 10 and the electronic component 20. In some embodiments, the substrate 10 is configured to transmit input power to the electronic component 20. In some embodiments, the substrate 10 is configured to provide a power path P5 between the substrate 10 and the electronic component 20.

The electronic component 20 may be disposed on the substrate 10. In some embodiments, the electronic component 20 has an active surface 201 and a passive surface 202 opposite to the active surface 201. In some embodiments, a signal (or an electrical signal) may be transmitted through the active surface 201. For example, the electronic component 20 may include an active element 21 (e.g., a circuit region) adjacent to the active surface 201. The active element 21 may be configured to transmit a signal to the substrate 10 and/or to receive a signal from the substrate 10. In some embodiments, the electronic component 20 may include one or more conductive vias (e.g., conductive vias 210, 220, 230, and 240) extending between the active surface 201 and the passive surface 202. The conductive vias 210, 220, 230, and 240 may provide electrical connections between the active surface 201 and the passive surface 202 of the electronic component 20. The conductive vias 210, 220, 230, and 240 may be exposed from the passive surface 202 of the electronic component 20. In some embodiments, the conductive vias 210, 220, 230, and 240 are physically separated. In some embodiments, the conductive vias 210, 220, 230, and 240 are electrically isolated.

In some embodiments, the electronic component 20 may be a circuit or a circuit element that relies on an external power supply to control or modify electrical signals. For example, the electronic component 20 may include a processor, a controller, a memory, or an input/output (I/O) buffer, etc. In some embodiments, the electronic component 20 may include, for example, a central processing unit (CPU), a microprocessor unit (MPU), a graphics processing unit (GPU), a microcontroller unit (MCU), an application-specific integrated circuit (ASIC), a field-programmable gate array (FPGA), or another type of integrated circuit.

The heat dissipation structure 30 may be disposed on the electronic component 20. The heat dissipation structure 30 may be or include a patterned heat dissipation structure. In some embodiments, the heat dissipation structure 30 includes a heat sink. In some embodiments, the heat dissipation structure 30 is disposed on the passive surface 202 of the electronic component 20. In some embodiments, the heat dissipation structure 30 is configured to transmit power to at least one of the conductive vias 210, 220, 230, and 240. In some embodiments, the heat dissipation structure 30 is configured to transmit power to the conductive via 210. In some embodiments, the heat dissipation structure 30 is configured to transmit a plurality of independent powers to the conductive vias 210, 220, 230, and 240 through the passive surface 202. In some embodiments, the heat dissipation structure 30 is configured to receive power without passing the electronic component 20 and to provide power to the electronic component 20. The power received by the heat dissipation structure 30 and the power provided to the electronic component 20 may have the same or different voltages. In some embodiments, the heat dissipation structure 30 is configured to receive power without passing the substrate 10. The heat dissipation structure 30 may be or include an electrical conductive material. In some embodiments, the heat dissipation structure 30 may be or include a metal, e.g., copper (Cu).

In some embodiments, the heat dissipation structure 30 includes a plurality of conductive elements (also referred to as "heat dissipation portions" or "heat dissipation structures") electrically isolated from one another. In some embodiments, the heat dissipation structure 30 includes conductive elements 31, 32, 33, and 34 which are electrically isolated from one another. In some embodiments, the conductive elements 31, 32, 33, and 34 of the heat dissipation structure 30 are physically separated from each other. In some embodiments, the conductive elements 31, 32, 33, and 34 of the heat dissipation structure 30 are configured to transmit the plurality of independent powers. The plurality of independent powers may include different powers (e.g., a first power and a second power different from the first power). In some embodiments, the conductive elements 31, 32, 33, and 34 of the heat dissipation structure 30 are configured to transmit power of different voltages. In some embodiments, the conductive elements 31, 32, 33, and 34 of the heat dissipation structure 30 are configured to transmit power of different voltages to different conductive vias of the electronic component 20. In some embodiments, the conductive element 31 of the heat dissipation structure 30 is configured to transmit power (also referred to as "the first power") to the conductive via 210. In some embodiments, the conductive element 32 of the heat dissipation structure 30 is configured to transmit power (also referred to as "the second power") to the conductive via 220. In some embodiments, the conductive element 33 of the heat dissipation structure 30 is configured to transmit power (also referred to as "a third power") to the conductive via 230. In some embodiments, the conductive element 34 of the heat dissipation structure 30 is configured to transmit power (also referred to as "a fourth power") to the conductive via 240. In some embodiments, the first power is different from the second power. In some embodiments, the first power, the second power, the third power, and the fourth power have different voltages.

In some embodiments, the conductive element 31 of the heat dissipation structure 30 is configured to receive power (also referred to as "a first input power") without passing the electronic component 20 and to provide power (also referred to as "a first power") to the electronic component 20. In some embodiments, the first input power and the first power may have the same or different voltages. In some embodiments, the conductive element 32 of the heat dissipation structure 30 is configured to receive power (also referred to as "a second input power") without passing the electronic component 20 and to provide power (also referred to as "a second power") to the electronic component 20. In some embodiments, the second input power and the second power may have the same or different voltages. In some embodiments, the conductive element 33 of the heat dissipation structure 30 is configured to receive power (also referred to as "a third input power") without passing the electronic component 20 and to provide power (also referred to as "a third power") to the electronic component 20. In some embodiments, the third input power and the third power may have the same or different voltages. In some embodiments, the conductive element 34 of the heat dissipation structure 30 is configured to receive power (also referred to as "a fourth input power") without passing the electronic component 20 and to provide power (also referred to as "a fourth power") to the electronic component 20. In some embodiments, the fourth input power and the fourth power may have the same or different voltages. In some embodiments, the first input power is different from the second input power. In some embodiments, the first input power, the second input power, the third input power, and the fourth input power have the same or different voltages. In some embodiments, the first power is different from the second power. In some embodiments, the first power, the second power, the third power, and the fourth power have the same or different voltages.

In some embodiments, the electronic component 20 and the respective conductive elements 31, 32, 33, and 34 are configured to provide a plurality of power paths passing through the passive surface 202. In some embodiments, the conductive element 31 of the heat dissipation structure 30 is disposed adjacent to the passive surface 202 of the electronic component 20 and configured to provide a power path P1 to the passive surface 202 of the electronic component 20. In some embodiments, the power path P1 is between an external power supply and the electronic component 20. In some embodiments, the power path P1 further passes through the conductive via 210 of the electronic component 20. In some embodiments, the conductive via 210 of the electronic component 20 and the conductive element 31 of the heat dissipation structure 30 are configured to provide the power path P1. In some embodiments, the conductive element 32 of the heat dissipation structure 30 is configured to provide a power path P2 to the passive surface 202 of the electronic component 20. In some embodiments, the power path P2 is between an external power supply and the electronic component 20. In some embodiments, the power path P2 further passes through the conductive via 220 of the electronic component 20. In some embodiments, the conductive via 220 of the electronic component 20 and the conductive element 32 of the heat dissipation structure 30 are configured to provide the power path P2. In some embodiments, the power path P1 and the power path P2 transmit power of different voltages.

In some embodiments, the conductive element 33 of the heat dissipation structure 30 is disposed adjacent to the passive surface 202 of the electronic component 20 and configured to provide a power path P3 to the passive surface 202 of the electronic component 20. In some embodiments, the power path P3 is between an external power supply and the electronic component 20. In some embodiments, the power path P3 further passes through the conductive via 230 of the electronic component 20. In some embodiments, the conductive via 230 of the electronic component 20 and the conductive element 33 of the heat dissipation structure 30 are configured to provide the power path P3. In some embodiments, the conductive element 34 of the heat dissipation structure 30 is configured to provide a power path P4 to the passive surface 202 of the electronic component 20. In some embodiments, the power path P4 is between an external power supply and the electronic component 20. In some embodiments, the power path P4 further passes through the conductive via 240 of the electronic component 20. In some embodiments, the conductive via 240 of the electronic component 20 and the conductive element 34 of the heat dissipation structure 30 are configured to provide the power path P4. In some embodiments, the power path P1, the power path P2, the power path P3, and the power path P4 transmit power of different voltages.

As used herein, a signal path may refer to a path through which an electrical signal may be transmitted. Such an electrical signal may include either analog or digital signals. Additionally, a power path, as used and described herein, may refer to a path dedicated to power supply connections.

In some embodiments, the conductive element 31 of the heat dissipation structure 30 overlaps the conductive via 210 from a top view perspective. In some embodiments, the conductive element 31 of the heat dissipation structure 30 is electrically connected to the conductive via 210. In some embodiments, the conductive element 32 of the heat dissipation structure 32 is free from overlapping the conductive via 210 from a top view perspective. In some embodiments, the conductive element 32 of the heat dissipation structure 32 is electrically isolated from the conductive via 210. In some embodiments, a portion of the passive surface 202 of the electronic component 20 is exposed by a gap G1 between the conductive element 31 and the conductive element 32 of the heat dissipation structure 30. In some embodiments, a portion of the passive surface 202 of the electronic component 20 is exposed by a gap G2 between the conductive element 32 and the conductive element 33 of the heat dissipation structure 30. In some embodiments, a portion of the passive surface 202 of the electronic component 20 is exposed by a gap G3 between the conductive element 33 and the conductive element 34 of the heat dissipation structure 30.

In some embodiments, each of the conductive elements 31, 32, 33, and 34 of the heat dissipation structure 30 includes a body and a plurality of protrusions connected to the body. For example, the conductive element 31 of the heat dissipation structure 30 can include a body 31B and a plurality of protrusions 31P connected thereto. The protrusions may extend upwards in a direction (e.g., Y-axis) away from the electronic component 20. In some embodiments, the protrusions are separated from each other. In some embodiments, an insulating thermal conductive material (not shown in drawings) may be disposed or filled in the space between the protrusions of the conductive elements 31, 32, 33, and 34 of the heat dissipation structure 30.

The thermal dissipation layer 40 may be disposed between the heat dissipation structure 30 and the electronic component 20. In some embodiments, the thermal dissipation layer 40 includes one or more connections (e.g., connections 41, 42, 43, and 44). In some embodiments, the connections 41, 42, 43, and 44 may be or include conductive elements. In some embodiments, the connections 41, 42, 43, and 44 are disposed between the heat dissipation structure 30 and the electronic component 20. In some embodiments, the connections 41, 42, 43, and 44 are configured to electrically connect the conductive elements 31, 32, 33, and 34 to the electronic component 20. In some embodiments, the connections 41, 42, 43, and 44 are formed within and passing an insulating layer (or a thermal dissipation insulating layer) of the thermal dissipation layer 40. In some embodiments, the insulating layer (or the thermal dissipation insulating layer) covers the connections 41, 42, 43, and 44 and exposes a portion of the connections 41, 42, 43, and 44. The insulating layer of the thermal dissipation layer 40 may be or include an insulating thermal conductive material. The insulating layer of the thermal dissipation layer 40 may be or include an adhesive layer. In some embodiments, the one or more conductive elements of the thermal dissipation layer 40 may electrically connect to the heat dissipation structure 30. In some embodiments, the one or more conductive elements of the thermal dissipation layer 40 may electrically connect to one or more conductive vias of the electronic component 20. In some embodiments, each of the connections 41, 42, 43, and 44 is disposed on one of the conductive vias 210, 220, 230, and 240 of the electronic component 20. For example, the connection 41 and the connection 42 can be respectively disposed on the conductive via 210 and the conductive via 220, and the connection 43 and the connection 44 are respectively disposed on the conductive via 230 and the conductive via 240. The conductive elements 31, 32, 33, and 34 of the heat dissipation structure 30 may transmit power of different voltages to different conductive vias 210, 220, 230, and 240 of the electronic component 20 through the connections 41, 42, 43, and 44 of the thermal dissipation layer 40.

The connection elements 70 may be disposed between the substrate 10 and the electronic component 20. In some embodiments, the connection elements 70 electrically connect the electronic component 20 and the substrate 10. In some embodiments, a signal (or an electrical signal) may be transmitted through the signal path S1 which passes the connection elements 70.

Figure 2A:
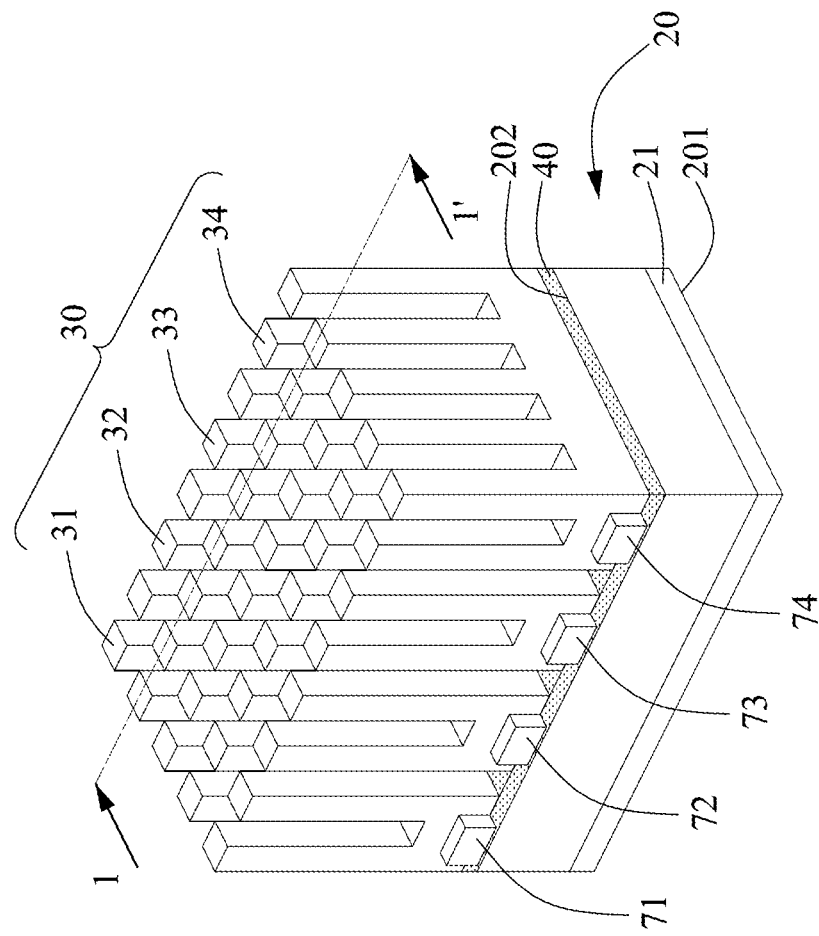
FIG. 2A is a three-dimensional view of an electronic device in accordance with some embodiments of the present disclosure.
Figure 2A:
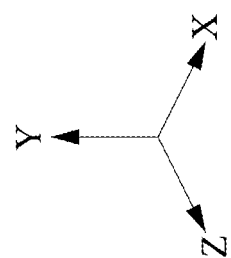
Figure 2B:
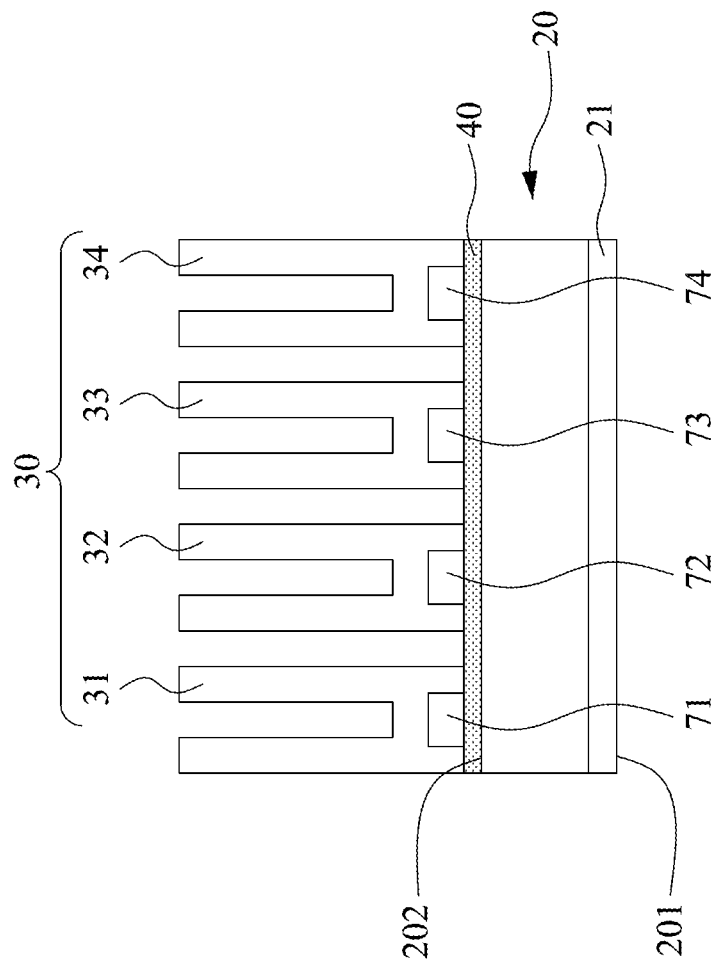
FIG. 2B is a side view of an electronic device in accordance with some embodiments of the present disclosure.

FIG. 2A is a three-dimensional view of an electronic device 1 in accordance with some embodiments of the present disclosure, and FIG. 2B is a side view of an electronic device 1 in accordance with some embodiments of the present disclosure. In some embodiments, FIG. 2B is a side view of the electronic device 1 illustrated in FIG. 1. In some embodiments, FIG. 1 is a cross-section along line 1-1' in FIG. 1. It should be noted that some elements have been omitted from FIGS. 2A and 2B for clarity.

In some embodiments, the electronic device 1 further includes one or more connectors (e.g., connectors 71, 72, 73, and 74). In some embodiments, the connectors are disposed on the heat dissipation structure 30. In some embodiments, each of the connectors 71, 72, 73, and 74 is disposed on each of the conductive elements 31, 32, 33, and 34 of the heat dissipation structure 30. In some embodiments, each of the connectors 71, 72, 73, and 74 is disposed on a side of each of the conductive elements 31, 32, 33, and 34 of the heat dissipation structure 30 and configured to electrically connect to a power supply. In some embodiments, each of the connectors 71, 72, 73, and 74 is electrically connected to each of the conductive elements 31, 32, 33, and 34 of the heat dissipation structure 30. In some embodiments, each of the connectors 71, 72, 73, and 74 is electrically connected to each of the conductive vias 210, 220, 230, and 240 through each of the conductive elements 31, 32, 33, and 34 of the heat dissipation structure 30. In some embodiments, the connectors 71, 72, 73, and 74 receive power of different voltages and transmit the power of different voltages to different conductive vias of the electronic component 20 through the conductive elements 31, 32, 33, and 34 of the heat dissipation structure 30. In some embodiments, the conductive elements 31, 32, 33, and 34 are arranged in an array. In some embodiments, the protrusions (e.g., the protrusions 31P of the conductive elements 31) of the conductive element 31 are arranged in an array. In some embodiments, the protrusions of the conductive elements 31, 32, 33, and 34 are arranged in an array.

According to some embodiments of the present disclosure, while electrical signals may be transmitted through the active surface 201 of the electronic component 20, the power may be transmitted through the passive surface 202 and passing the conductive vias of the electronic component 202, the heat dissipation structure 30 may be configured to receive input power without passing the electronic component 20 and provide output power to the electronic component 20. Therefore, the heat dissipation structure 30 can assume multiple functions in terms of providing heat dissipation paths as well as power paths, and thus package size can be reduced as well.

In addition, while power supply terminals are disposed on the passive surface of an electronic component and electrically connected to the conductive vias of the electronic component, a conventional heat sink disposed on the passive surface of the electronic component may cause short-circuiting between the power supply terminals. In contracts, according to some embodiments of the present disclosure, the heat dissipation structure 30 includes conductive elements that are physically separated and/or electrically insulated from one another, and thus short-circuits between terminals of different power voltages can be prevented.

In addition, according to some embodiments of the present disclosure, the heat dissipation structure 30 is configured to receive power without passing the substrate 10. Therefore, the power path can be reduced, and thus the resistance of the power path can be further reduced.

Figure 3:
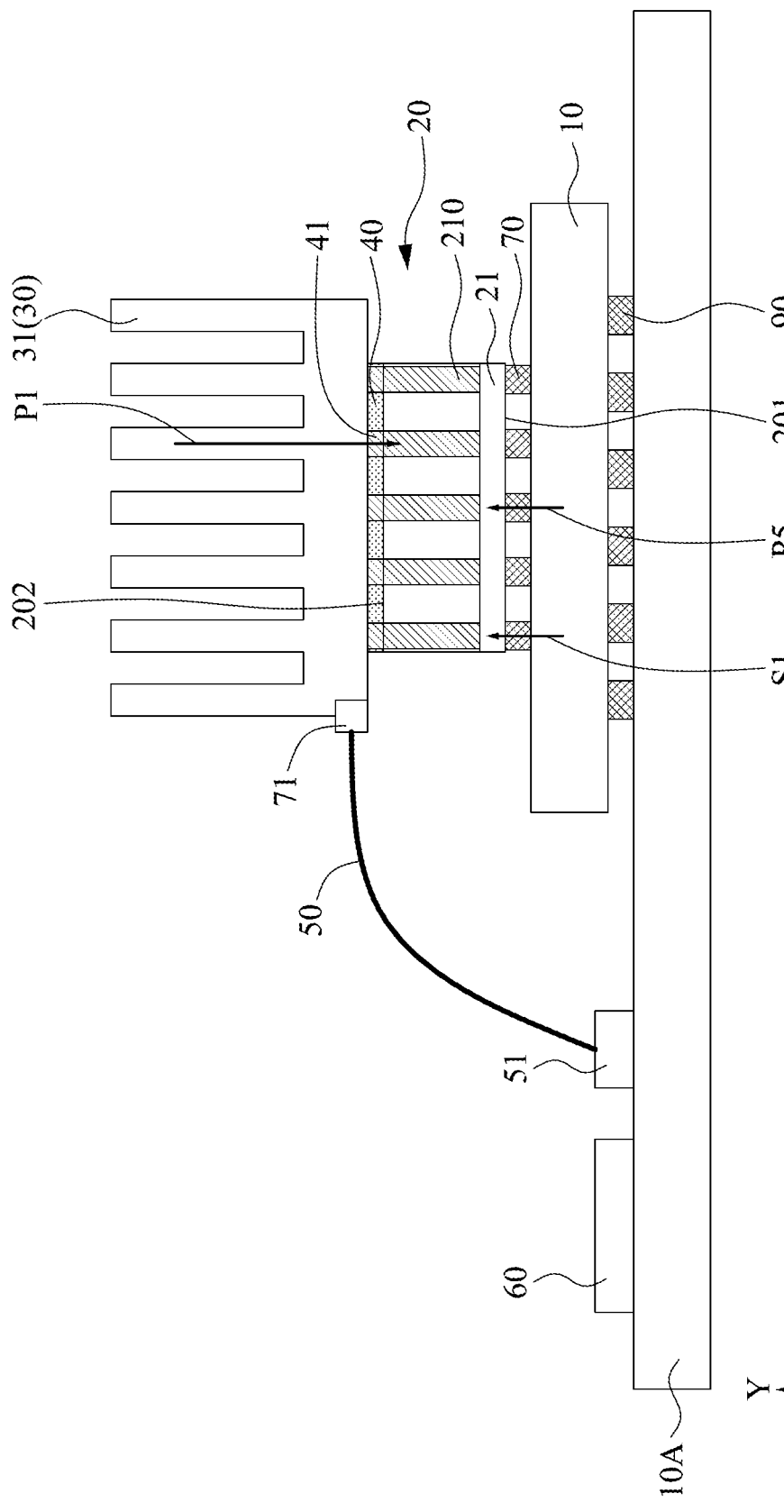
FIG. 3 is a cross-section of an electronic device in accordance with some embodiments of the present disclosure.

FIG. 3 is a cross-section of an electronic device 3 in accordance with some embodiments of the present disclosure. The electronic device 3 is similar to the electronic device 1 in FIG. 1, with differences therebetween as follows. Descriptions of similar components are omitted.

The electronic device 3 may further include a carrier 10A, one or more electrical connections 50, a connector 51, a power regulating component 60, and one or more connection elements 90. In some embodiments, the electrical connection 50 may be or include a conductive wire. In addition, although only one conductive element 31 of the heat dissipation structure 30 is shown in FIG. 3, the heat dissipation structure 30 of the electronic device 3 may include a plurality of conductive elements (e.g., the conductive elements 31, 32, 33, and 34 illustrated in FIGS. 1 and 2A-2B), and the number of the conductive elements of the heat dissipation structure 30 is not limited thereto.

In some embodiments, the carrier 10A may include, for example, a printed circuit board, such as a paper-based copper foil laminate, a composite copper foil laminate, or a polymer-impregnated glass-fiber-based copper foil laminate. The carrier 10A may include a multilayer substrate which includes a core layer and one or more conductive materials and/or structures disposed on an upper surface and a bottom surface of the carrier 10A. The carrier 10A may include an interconnection structure, such as a plurality of conductive traces and/or a plurality of through vias. For example, the carrier 10A may include a redistribution layer (RDL) and/or a grounding element. In some embodiments, the carrier 10A includes a ceramic material or a metal plate. In some embodiments, the carrier 10A may include an organic substrate or a leadframe. In some embodiments, the carrier 10A supports and electrically connects to the substrate 10. In some embodiments, the substrate 10 is electrically connected to the carrier 10A through connection element 90.

In some embodiments, a power supply may be disposed on or connected to the carrier 10A. In some embodiments, supplied power may be transmitted to the heat dissipation structure 30 as input power through the electrical connection 50. In some embodiments, the carrier 10A is configured to provide power by the electrical connection 50 at a lateral side of the substrate 10 and the electronic component 20.

In some embodiments, the power regulating component 60 is disposed on the carrier 10A. In some embodiments, the power regulating component 60 is electrically connected to the heat dissipation structure 30. In some embodiments, the power regulating component 60 may include a power management integrated circuit (PMIC). The power regulating component 60 may be configured to provide one or more types of power control to the electronic component 20 of the electronic device 3. For example, the power regulating component 60 may be configured to provide regulated power to the electronic component 20. For example, the power regulating component 60 may be configured to provide one or various different output power to the electronic component 20. In some embodiments, the power regulating component 60 may include a voltage regulator, such as a linear regulator (configured to maintain a constant output voltage) or a switching regulator (configured to generate an output voltage higher than or lower than the input voltage). In some embodiments, the power regulating component 60 may include a step-down (buck) converter, a step-up (boost) converter, an analog-to-digital converter, a digital-to-analog converter, an AC-DC converter, a DC-DC converter, other types of converters, or a combination thereof. In some embodiments, the power regulating component 60 may further include one or more inductance devices (or inductors) and one or more capacitance devices (or capacitors) integrated with the voltage regulator and/or the converter. Other examples of passive devices may include, for example, resistors, diodes, fuses or antifuses, etc., and may be included along with the inductance devices and the capacitance devices within the power regulating component 60.

In some embodiments, the power regulating component 60 is configured to receive power not through the heat dissipation structure 30. In some embodiments, the conductive elements 31, 32, 33, and 34 of the heat dissipation structure 30 are configured to receive a plurality of powers from the power regulating component 60. In some embodiments, the power regulating component 60 is configured to provide a plurality of power paths between the heat dissipation structure 30 and the power regulating component 60. In some embodiments, the power regulating component 60 is configured to transmit power (also referred to as "a first power") to the conductive element 31 of the heat dissipation structure 30. In some embodiments, the power regulating component 60 is configured to receive input power (also referred to as "a first input power") from a power supply, regulate the input power, and then provide output power (also referred to as "the first power" or "a first regulated input power") to the electronic component 20 through an electrical connection 50 and the heat dissipation structure 30. In some embodiments, the electrical connection 50 is electrically connected to the carrier 10A through the connector 51. In some embodiments, the power regulating component 60 is disposed on the carrier 10A and electrically connected to the electrical connection 50 through an interconnection structure (e.g., an RDL or a plurality of conductive traces and conductive vias) of the carrier 10A. In some embodiments, the output power (or the regulated input power) provided by the power regulating component 60 is transmitted through the carrier 10A, the electrical connection 50, and the heat dissipation structure 30 to the electronic component 20.

In some embodiments, the power regulating component 60 is configured to further transmit power (also referred to as "a second power") to the conductive element 32 (not shown in FIG. 3) of the heat dissipation structure 30. In some embodiments, the power regulating component 60 is configured to receive input power (also referred to as "a second input power") from a power supply, regulate the input power, and then provide output power (also referred to as "the second power" or "a second regulated input power") to the electronic component 20 through an electrical connection 50 and the heat dissipation structure 30.

In some embodiments, the conductive element 31 of the heat dissipation structure 30 is configured to receive power without passing the electronic component 20 and to provide power (also referred to as "the first power" or "the first regulated input power") to the electronic component 20. In some embodiments, the conductive element 31 of the heat dissipation structure 30 is configured to transmit power (or "the first power" or "the first regulated input power") to the conductive via 210. In some embodiments, the conductive element 32 (not shown in FIG. 3) of the heat dissipation structure 30 is configured to receive power without passing the electronic component 20 and to provide power (also referred to as "the second power" or "the second regulated input power") to the electronic component 20. In some embodiments, the conductive element 32 of the heat dissipation structure 30 is configured to transmit power (or "the second power" or "the second regulated input power") to the conductive via 220. In some embodiments, the first power (or the first regulated input power) is different from the second power (or the second regulated input power).

In some embodiments, in addition to the power path P1 provided by the heat dissipation structure 30, another power path P5 provided by the substrate 10 is configured to transmit power to the active surface 201 of the electronic component 20.

In some embodiments, the electrical connection 50 may be or include a bond wire or a cable, and/or a flexible printed circuit (FPC) board. In some embodiments, a stiffener may be further formed within or covering the electrical connection 50 to enhance the strength of the electrical connection 50.

Figure 4:
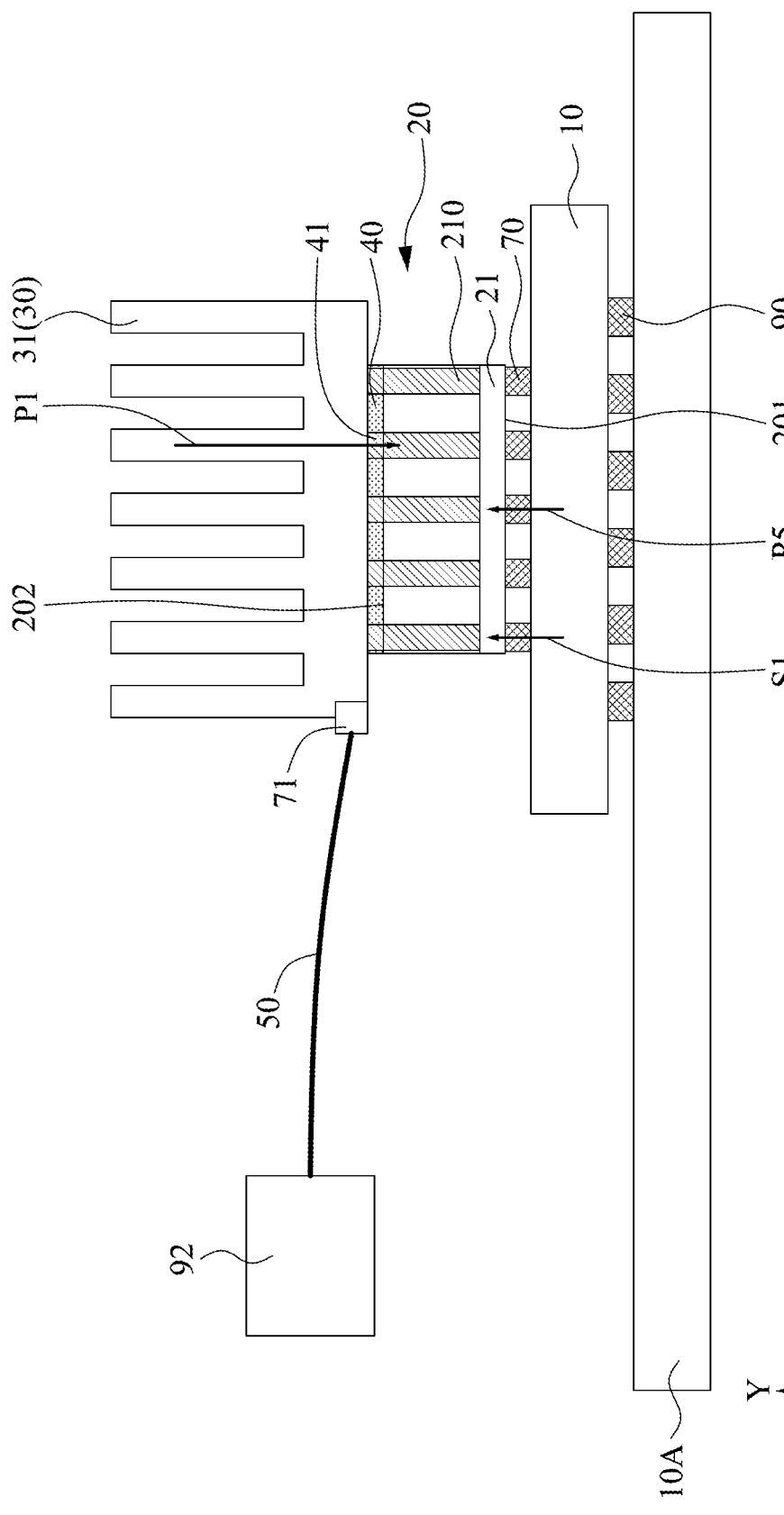
FIG. 4 is a cross-section of an electronic device in accordance with some embodiments of the present disclosure.

FIG. 4 is a cross-section of an electronic device 4 in accordance with some embodiments of the present disclosure. The electronic device 4 is similar to the electronic device 3 in FIG. 3, with differences therebetween as follows. Descriptions of similar components are omitted.

In some embodiments, the heat dissipation structure 30 is directly electrically connected to a power supply 92 through the electrical connection 50. In some embodiments, the power supply 92 is disposed outside of the substrate 10 and the carrier 10A.

Figure 5:
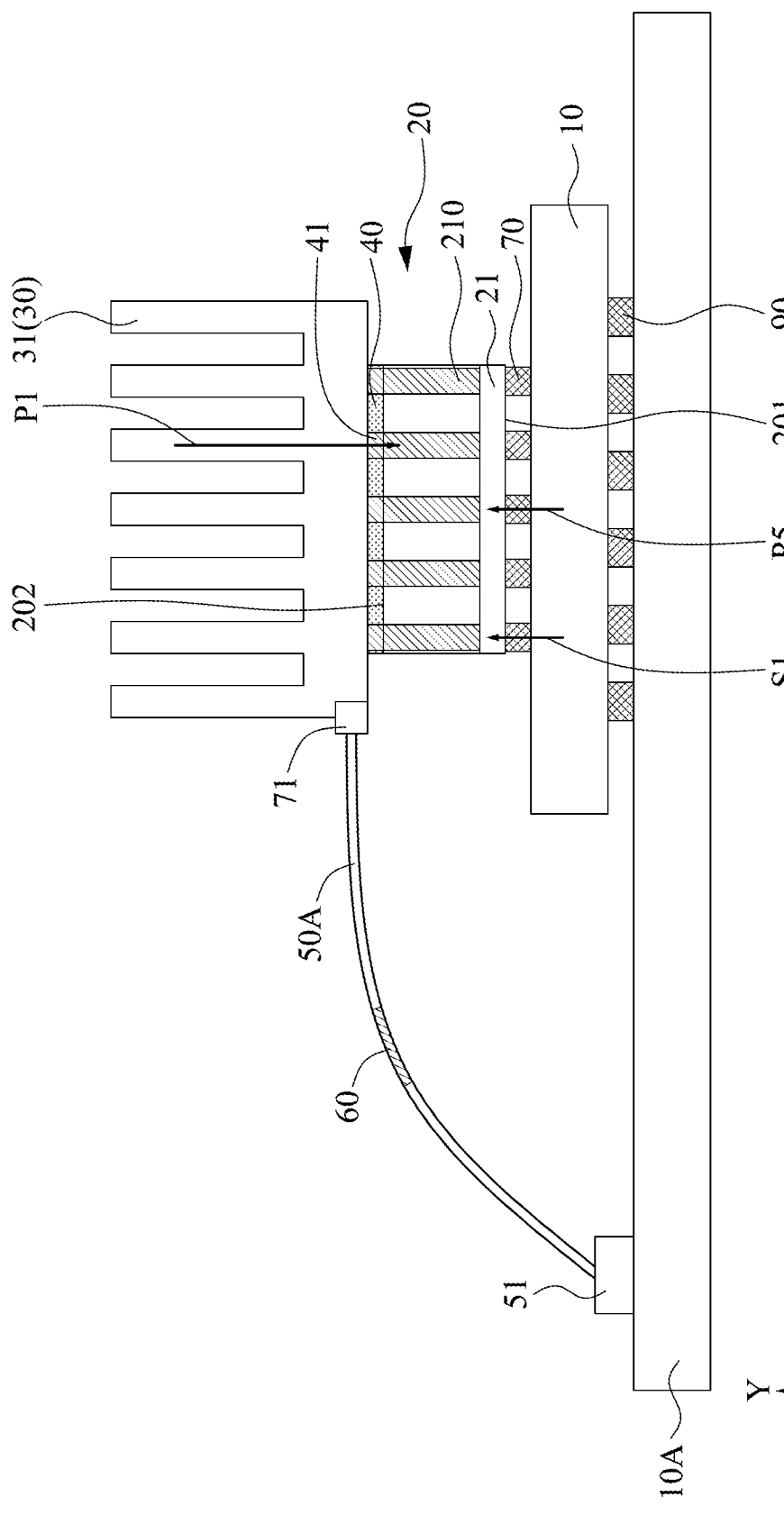
FIG. 5 is a cross-section of an electronic device in accordance with some embodiments of the present disclosure.

FIG. 5 is a cross-section of an electronic device 5 in accordance with some embodiments of the present disclosure. The electronic device 5 is similar to the electronic device 3 in FIG. 3, with differences therebetween as follows. Descriptions of similar components are omitted.

In some embodiments, the heat dissipation structure 30 is configured to receive power through an electrical connection 50A. In some embodiments, the electrical connection 50A may be or include a flexible substrate. In some embodiments, the power regulating component 60 is disposed on or within the electrical connection 50A. In some embodiments, the power regulating component 60 is configured to provide regulated power to the heat dissipation structure 30. In some embodiments, the power regulating component 60 is configured to receive input power transmitted through the electrical connection 50A, regulate the input power, and then provide output power to the heat dissipation structure 30 through the electrical connection 50A. In some embodiments, the electrical connection 50A may be or include a flexible printed circuit (FPC) board. According to some embodiments of the present disclosure, the power regulating component 60 integrated with the electrical connection 50A is advantageous in reduction of size of electronic device 5.

Figure 6:
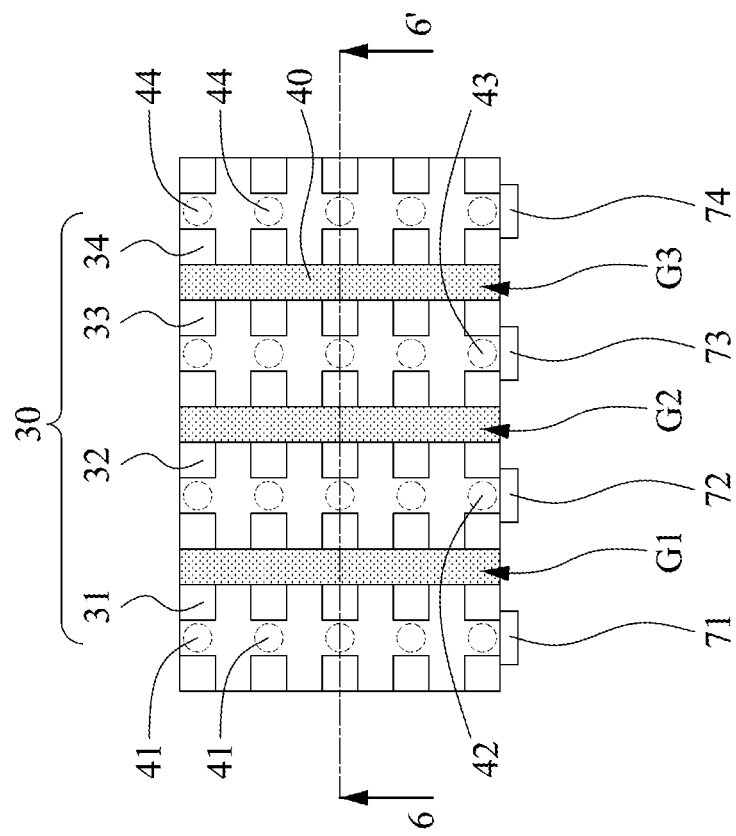
FIG. 6 is a top view of an electronic device in accordance with some embodiments of the present disclosure.

FIG. 6 is a top view of an electronic device in accordance with some embodiments of the present disclosure. In some embodiments, FIG. 6 is a top view of the electronic device 1 illustrated in FIGS. 1 and 2A-2B, the electronic device 3 illustrated in FIG. 3, the electronic device 4 illustrated in FIG. 4, or the electronic device 5 illustrated in FIG. 5. 1. In some embodiments, FIG. 1 is a cross-section along line 6-6' in FIG. 6. It should be noted that some elements have been omitted from FIG. 6 for clarity.

In some embodiments, the conductive elements 31, 32, 33, and 34 of the heat dissipation structure 30 are physically separated. In some embodiments, a portion of the top surface of the thermal dissipation layer 40 is exposed by a gap G1 between the conductive element 31 and the conductive element 32 of the heat dissipation structure 30. In some embodiments, a portion of the top surface of the thermal dissipation layer 40 is exposed by a gap G2 between the conductive element 32 and the conductive element 33 of the heat dissipation structure 30. In some embodiments, a portion of the top surface of the thermal dissipation layer 40 is exposed by a gap G3 between the conductive element 33 and the conductive element 34 of the heat dissipation structure 30.

In some embodiments, the heat dissipation layer 40 includes a plurality of connections 41, 42, 43, and 44. In some embodiments, the conductive elements 41 are disposed directly under the conductive element 31 of the heat dissipation structure 30. In some embodiments, the conductive elements 42 are disposed directly under the conductive element 32 of the heat dissipation structure 30. In some embodiments, the conductive elements 43 are disposed directly under the conductive element 33 of the heat dissipation structure 30. In some embodiments, the conductive elements 44 are disposed directly under the conductive element 34 of the heat dissipation structure 30.

Figure 7A:
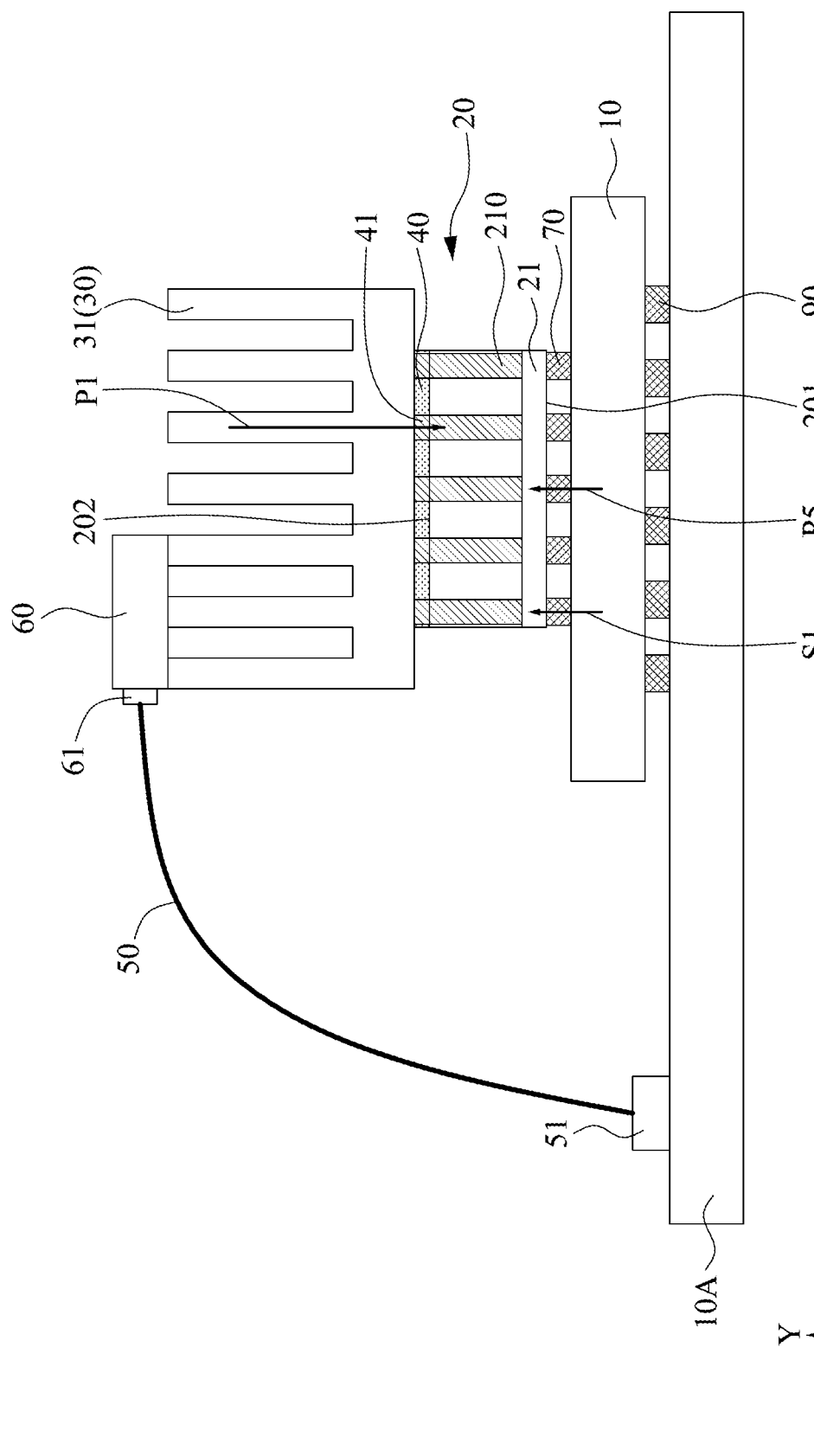
FIG. 7A is a cross-section of an electronic device in accordance with some embodiments of the present disclosure.

FIG. 7A is a cross-section of an electronic device 7A in accordance with some embodiments of the present disclosure. The electronic device 7A is similar to the electronic device 3 in FIG. 3, with differences therebetween as follows. Descriptions of similar components are omitted.

In some embodiments, the power regulating component 60 is disposed on the heat dissipation structure 30. In some embodiments, the power regulating component 60 is between the electrical connection 50 and the heat dissipation structure 30. In some embodiments, the power regulating component 60 is electrically connected to the electrical connection 50 through a connector 61. In some embodiments, the connector 61 is disposed on a side of the power regulating component 60 and configured to electrically connect to an external power supply. In some embodiments, the power regulating component 60 is configured to receive input power transmitted through the electrical connection 50, regulate the input power, and then provide output power (also referred to as "a regulated input power") to the heat dissipation structure 30. In some embodiments, the power regulating component 60 is configured to receive input power without passing the electronic component 20 and/or the substrate 10, regulate the input power, and then provide output power (also referred to as "a regulated input power") to the electronic component 20 through the heat dissipation structure 30.

Figure 7B:
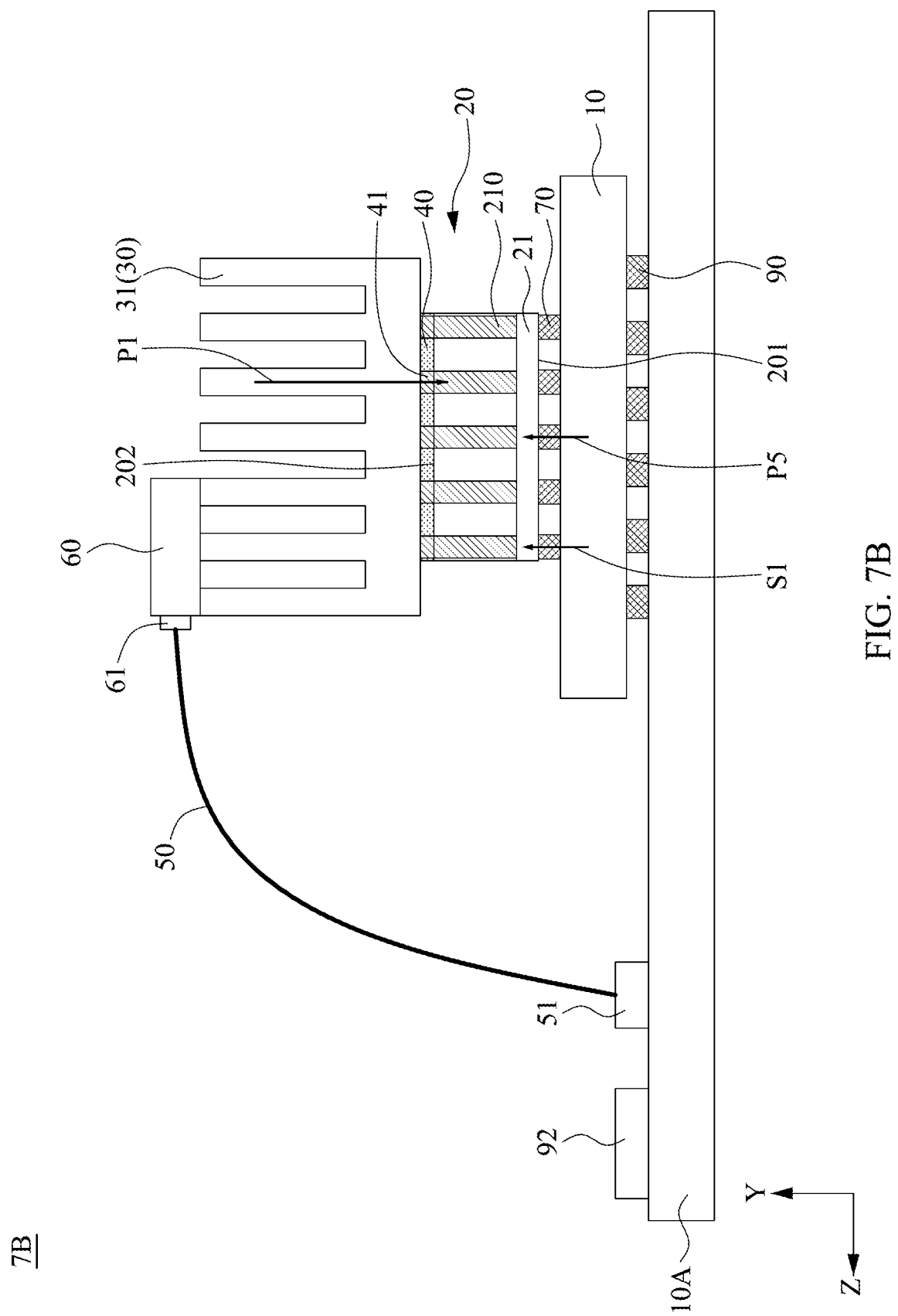
FIG. 7B is a cross-section of an electronic device in accordance with some embodiments of the present disclosure.

FIG. 7B is a cross-section of an electronic device 7B in accordance with some embodiments of the present disclosure. The electronic device 7B is similar to the electronic device 7A in FIG. 7A, with differences therebetween as follows. Descriptions of similar components are omitted.

In some embodiments, the power supply 92 is disposed on the carrier 10A. In some embodiments, the supplied power may be transmitted from the power supply 92 to the connector 51 through the carrier 10A (e.g., an interconnection structure within the carrier 10A).

Figure 7C:
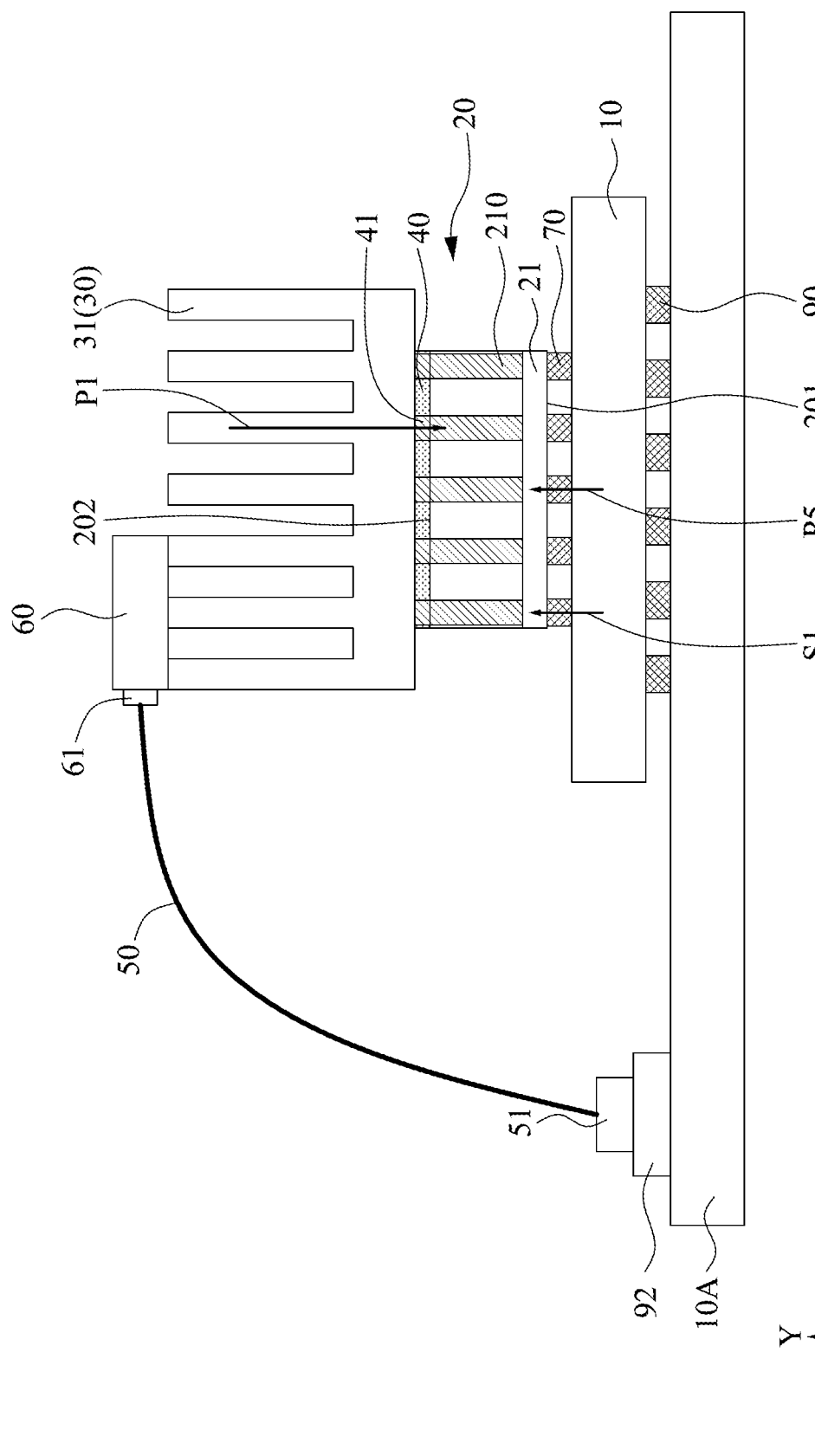
FIG. 7C is a cross-section of an electronic device in accordance with some embodiments of the present disclosure.

FIG. 7C is a cross-section of an electronic device 7C in accordance with some embodiments of the present disclosure. The electronic device 7C is similar to the electronic device 7A in FIG. 7A, with differences therebetween as follows. Descriptions of similar components are omitted.

In some embodiments, the power supply 92 is disposed on the carrier 10A, and the connector 51 is disposed on the power supply 92. In some embodiments, the supplied power may be transmitted from the power supply 92 to the electrical connection 50 through the connector 51.

Figure 8A:
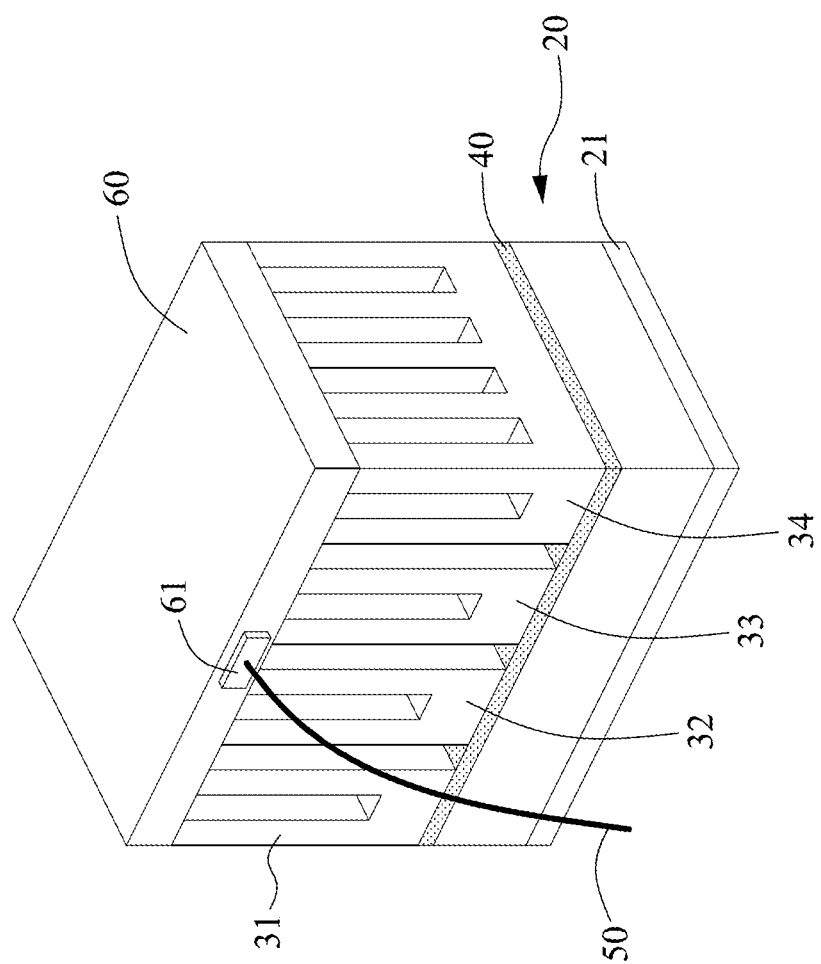
FIG. 8A is a three-dimensional view of an electronic device in accordance with some embodiments of the present disclosure.

FIG. 8A is a three-dimensional view of an electronic device in accordance with some embodiments of the present disclosure. In some embodiments, FIG. 8A is a three-dimensional view of the electronic device 7 illustrated in FIG. 7.

In some embodiments, the power regulating component 60 is disposed over the heat dissipation structure 30. In some embodiments, the power regulating component 60 is connected to the electrical connection 50 which connects to a power supply. The electrical connection 50 may be connected to the power regulating component 60 through the connector 61. The power regulating component 60 may be configured to provide various types of power control to the electronic component 20. In some embodiments, input power (or an input voltage) may be transmitted to the power regulating component 60 through the electrical connection 50, and the power regulating component 60 is configured to provide different regulated power (or output voltages) to the electronic component 20. For example, the power regulating component 60 may be configured to regulate one input power voltage to different output voltages to the electronic component 20 through separate conductive elements 31, 32, 33, and 34 of the heat dissipation structure 30.

Figure 8B:
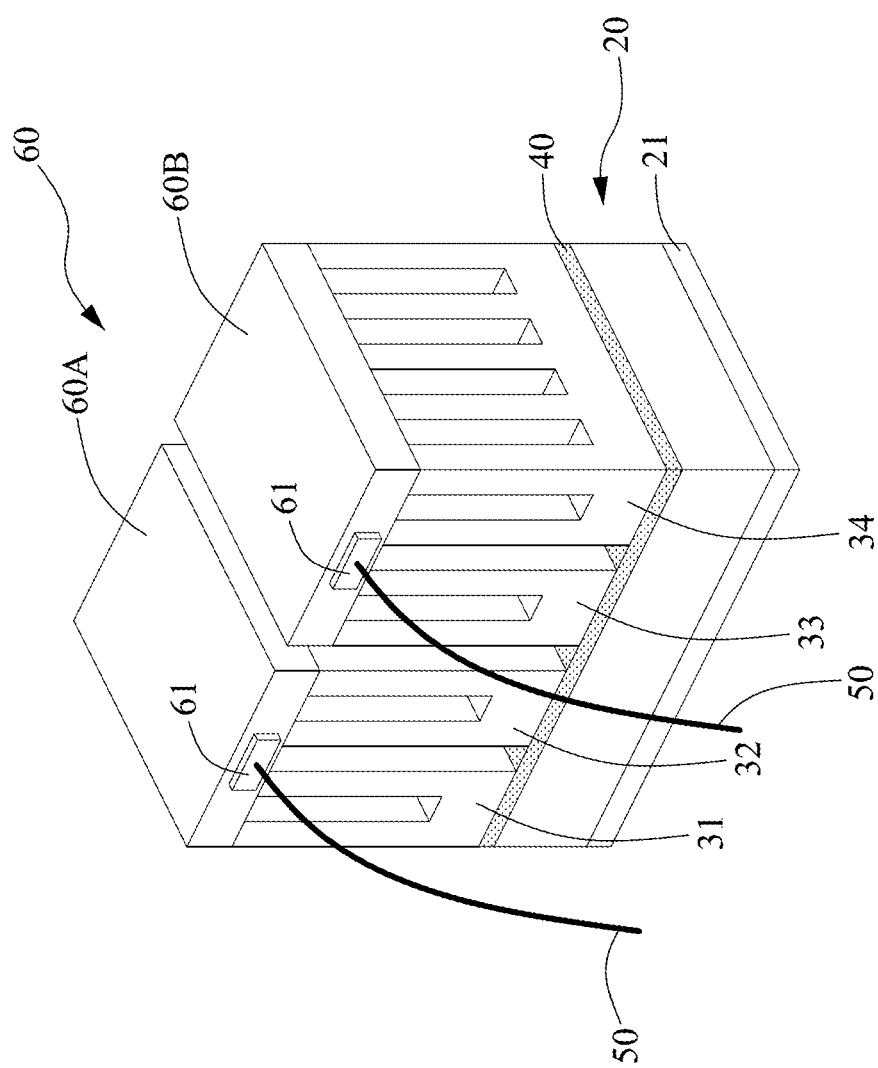
FIG. 8B is a three-dimensional view of an electronic device in accordance with some embodiments of the present disclosure.

FIG. 8B is a three-dimensional view of an electronic device in accordance with some embodiments of the present disclosure. In some embodiments, FIG. 8B is a three-dimensional view of the electronic device 7 illustrated in FIG. 7.

In some embodiments, the power regulating component 60 may include a plurality of parts (e.g., parts 60A and 60B), and each of the parts is connected to at least two conductive elements of the heat dissipation structure 30. In some embodiments, the power regulating component 60 includes parts 60A and 60B. In some embodiments, the parts 60A and 60B may be referred to as power regulating elements or power regulating units. In some embodiments, the part 60A is connected to the conductive elements 31 and 32, and the part 60B is connected to the conductive elements 33 and 34. In some embodiments, the parts 60A and 60B are configured to receive different input powers. In some embodiments, the parts 60A and 60B are configured to transmit different output power. In some embodiments, input power (or an input voltage) may be transmitted to the part 60A through an electrical connection 50, and the part 60A is configured to regulate the input power and provide different regulated power (or output voltages) to the electronic component 20 through separate conductive elements 31 and 32 of the heat dissipation structure 30. In some embodiments, input power (or an input voltage) may be transmitted to the part 60B through an electrical connection 50, and the part 60B is configured to regulate the input power and provide different regulated power (or output voltages) to the electronic component 20 through separate conductive elements 33 and 34 of the heat dissipation structure 30.

Figure 8C:
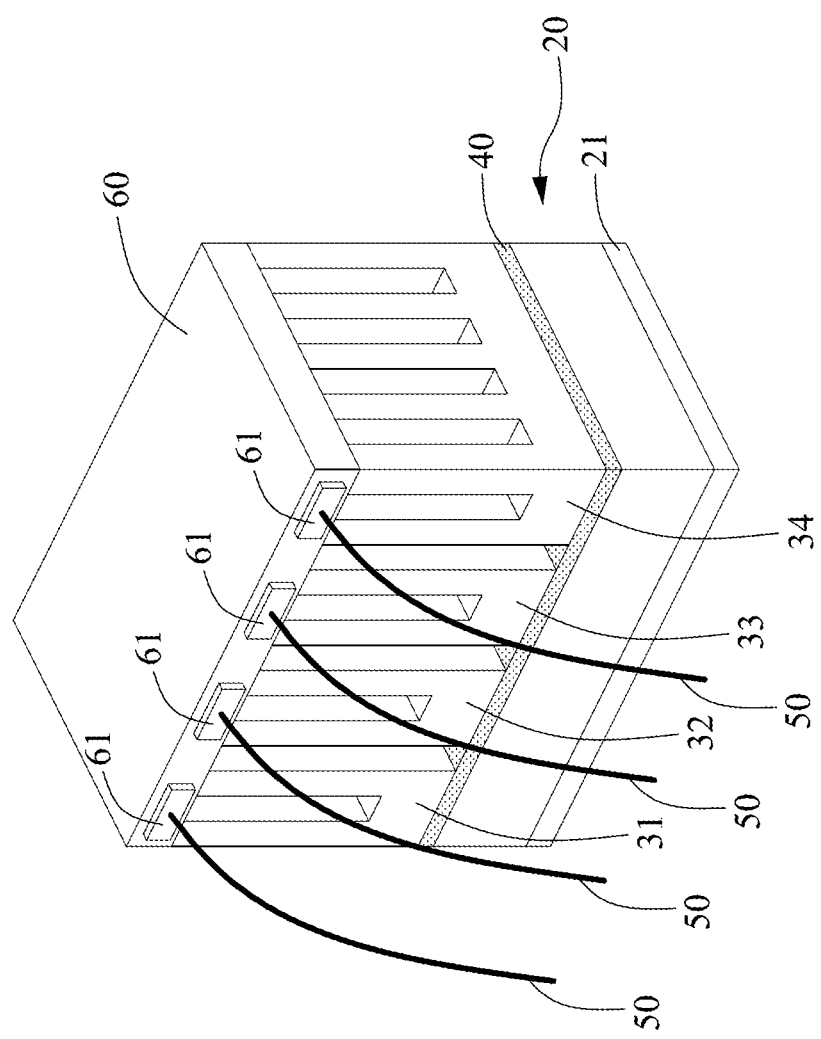
FIG. 8C is a three-dimensional view of an electronic device in accordance with some embodiments of the present disclosure.

FIG. 8C is a three-dimensional view of an electronic device in accordance with some embodiments of the present disclosure. In some embodiments, FIG. 8B is a three-dimensional view of the electronic device 7 illustrated in FIG. 7.

In some embodiments, the power regulating component 60 is configured to receive various different input power. In some embodiments, the power regulating component 60 is configured to transmit various different output power. In some embodiments, four different input power (or input voltages) may be transmitted to the power regulating component 60 through four different electrical connections 50, and the power regulating component 60 is configured to regulate the input powers and provide regulated power (or output voltages) to the electronic component 20 through separate conductive elements 31, 32, 33, and 34 of the heat dissipation structure 30.

Figure 9A:
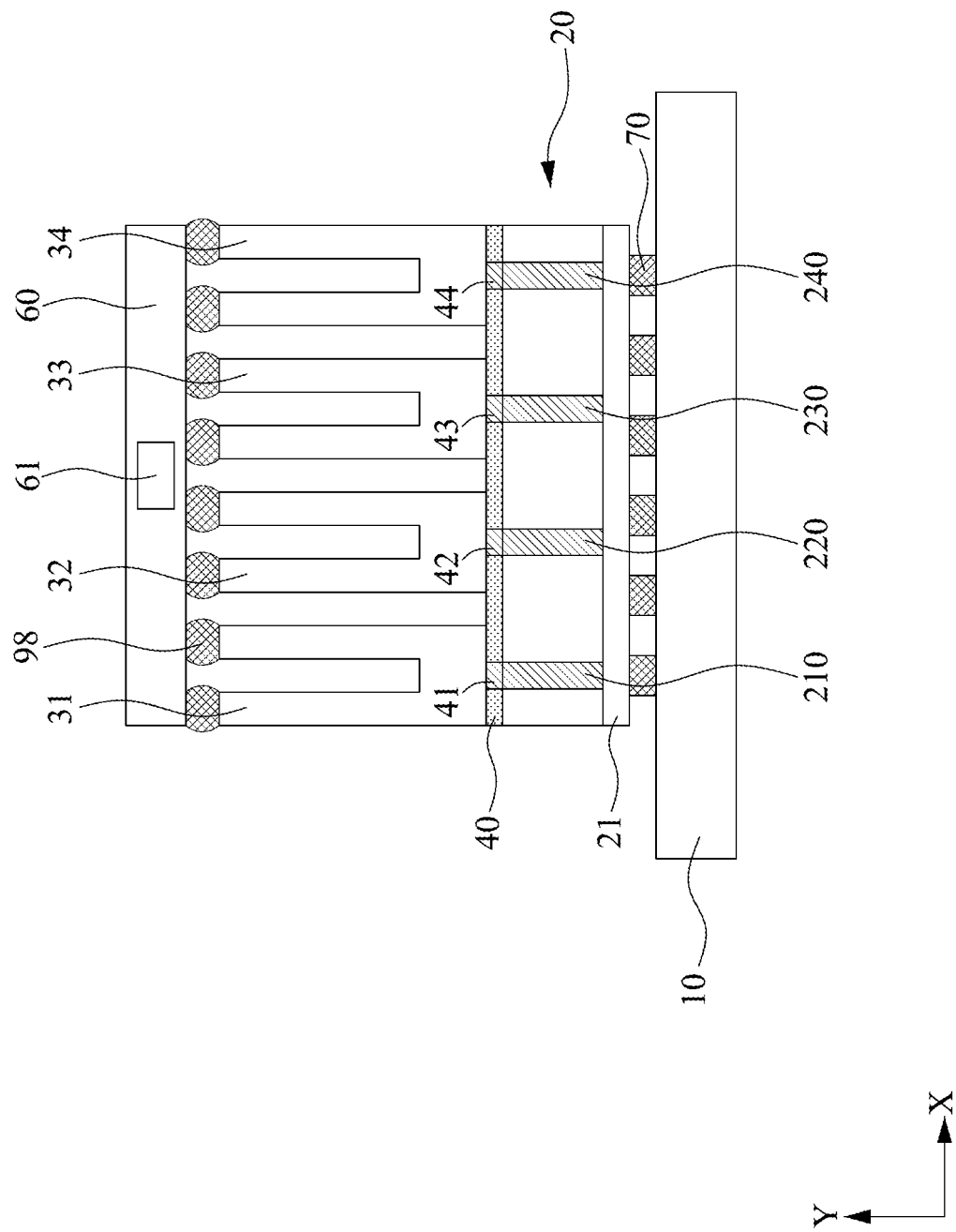
FIG. 9A is a cross-section of an electronic device in accordance with some embodiments of the present disclosure.

FIG. 9A is a cross-section of an electronic device in accordance with some embodiments of the present disclosure. In some embodiments, FIG. 9A is a cross-section of the electronic device illustrated in FIG. 8A.

In some embodiments, the power regulating component 60 is disposed over the heat dissipation structure 30 and electrically connected to the heat dissipation structure 30 through a plurality of conductive bumps 98. In some embodiments, the power regulating component 60 is electrically connected to the heat dissipation structure 30 through one or more conductive bumps 98. In some embodiments, the power regulating component 60 is electrically connected to each of the conductive elements 31, 32, 33, and 34 of the heat dissipation structure 30 through one or more conductive bumps 98.

Figure 9B:
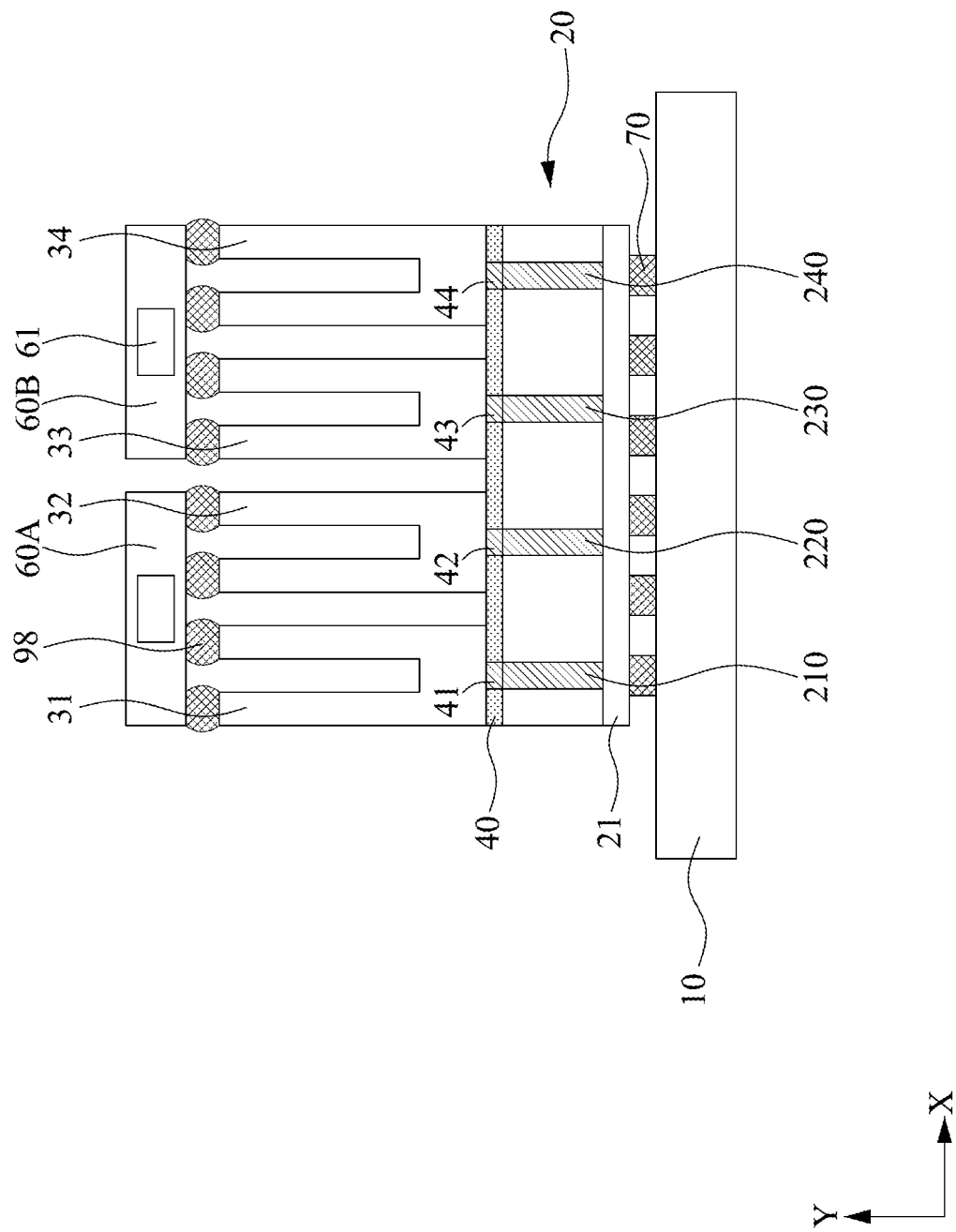
FIG. 9B is a cross-section of an electronic device in accordance with some embodiments of the present disclosure.

FIG. 9B is a cross-section of an electronic device in accordance with some embodiments of the present disclosure. In some embodiments, FIG. 9B is a cross-section of the electronic device illustrated in FIG. 8B.

In some embodiments, the power regulating elements 60A and 60B of the power regulating component 60 are electrically connected to the heat dissipation structure 30 through a plurality of conductive bumps 98. In some embodiments, the power regulating element 60A is electrically connected to each of the conductive elements 31 and 32 of the heat dissipation structure 30 through one or more conductive bumps 98. In some embodiments, the power regulating element 60B is electrically connected to each of the conductive elements 33 and 34 of the heat dissipation structure 30 through one or more conductive bumps 98.

Figure 9C:
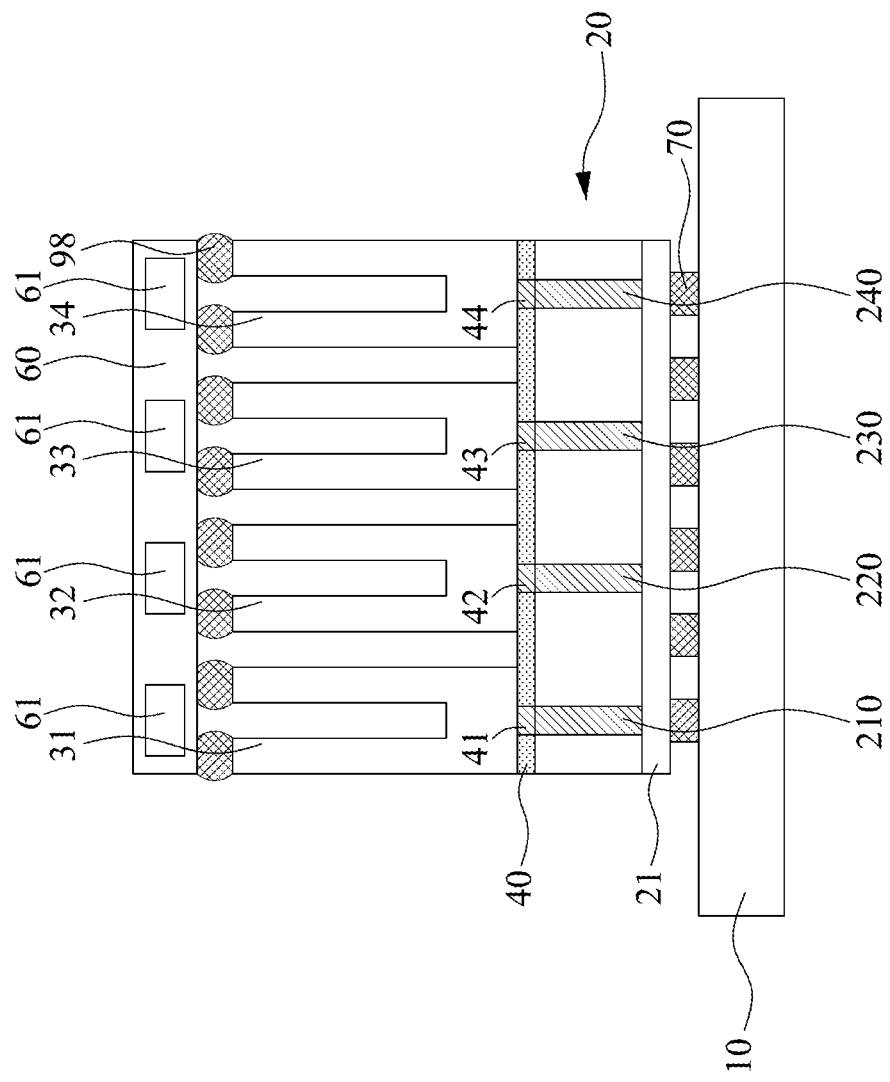
FIG. 9C is a cross-section of an electronic device in accordance with some embodiments of the present disclosure.

FIG. 9C is a cross-section of an electronic device in accordance with some embodiments of the present disclosure. In some embodiments, FIG. 9C is a cross-section of the electronic device illustrated in FIG. 8C.

In some embodiments, the power regulating component 60 is electrically connected to the heat dissipation structure 30 through one or more conductive bumps 98. In some embodiments, the power regulating component 60 is electrically connected to each of the conductive elements 31, 32, 33, and 34 of the heat dissipation structure 30 through one or more conductive bumps 98.

Figure 10A:
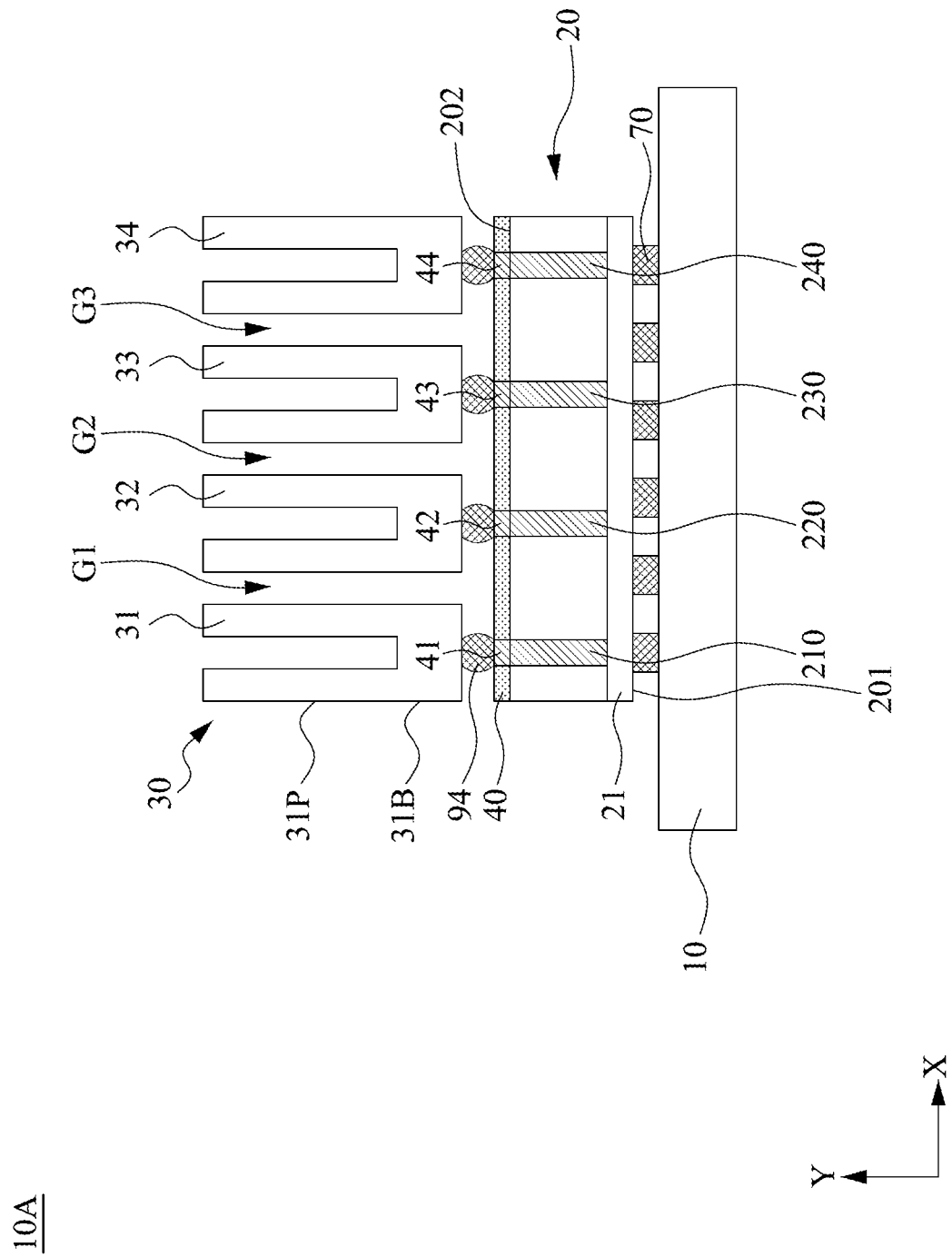
FIG. 10A is a cross-section of an electronic device in accordance with some embodiments of the present disclosure.

FIG. 10A is a cross-section of an electronic device 10A in accordance with some embodiments of the present disclosure. The electronic device 10A is similar to the electronic device 1 in FIG. 1, with differences therebetween as follows. Descriptions of similar components are omitted.

In some embodiments, the electronic device 10A further includes one or more conductive bumps 94 between the heat dissipation structure 30 and the thermal dissipation layer 40. In some embodiments, the heat dissipation structure 30 is connected to the thermal dissipation layer 40 through one or more conductive bumps 94. In some embodiments, each of the conductive elements 31, 32, 33, and 34 of the heat dissipation structure 30 is connected to the thermal dissipation layer 40 through one or more conductive bumps 94. In some embodiments, the conductive element 31 of the heat dissipation structure 30 is electrically connected to or bonded to the connection 41 of the thermal dissipation layer 40 through a conductive bump 94. In some embodiments, the conductive element 32 of the heat dissipation structure 30 is electrically connected to or bonded to the connection 42 of the thermal dissipation layer 40 through a conductive bump 94. In some embodiments, the conductive element 33 of the heat dissipation structure 30 is electrically connected to or bonded to the connection 43 of the thermal dissipation layer 40 through a conductive bump 94. In some embodiments, the conductive element 34 of the heat dissipation structure 30 is electrically connected to or bonded to the connection 44 of the thermal dissipation layer 40 through a conductive bump 94. In some embodiments, the conductive bumps 94 may be or include a conductive adhesive material, a soldering material, or a combination thereof.

Figure 10B:
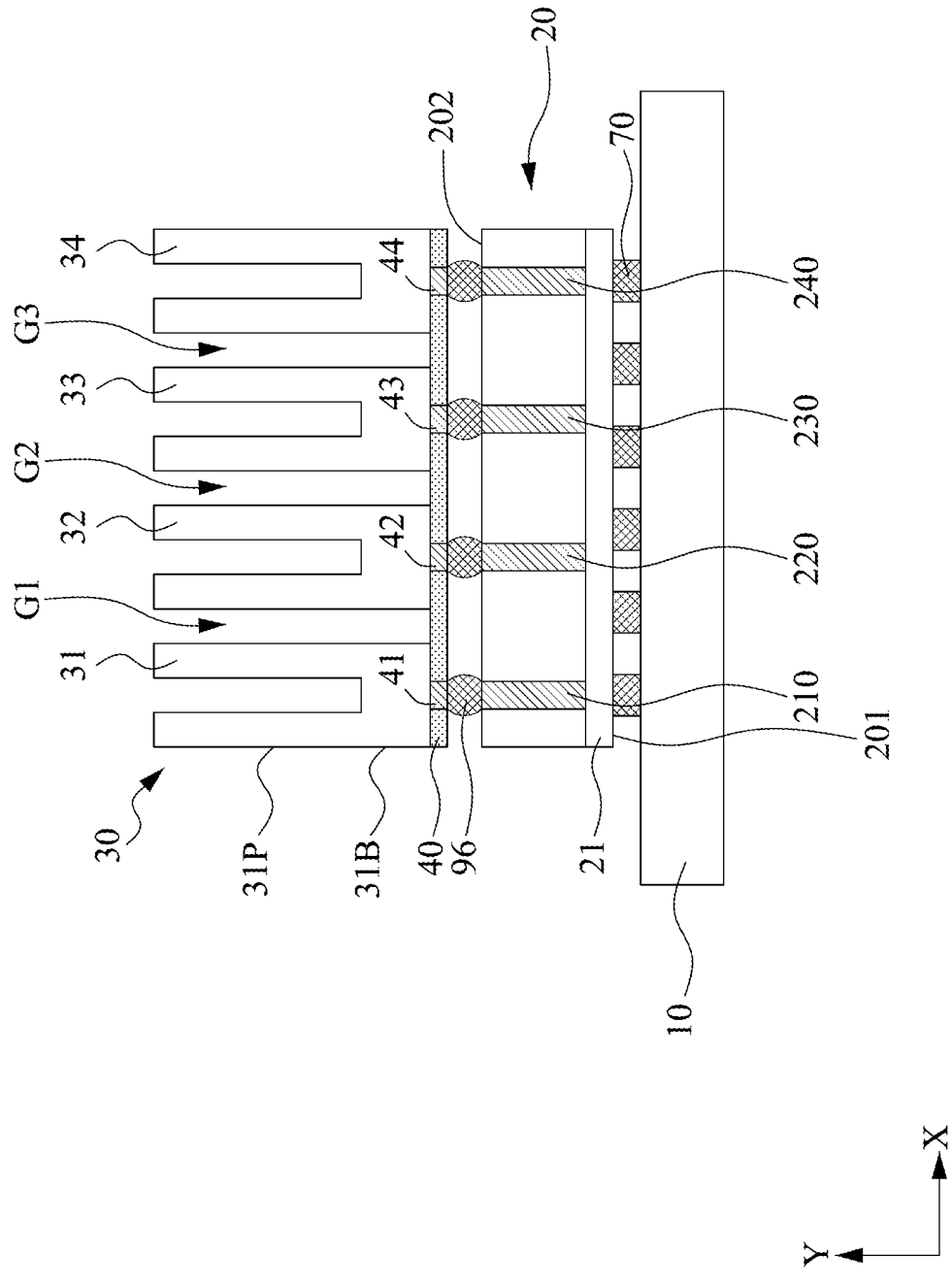
FIG. 10B is a cross-section of an electronic device in accordance with some embodiments of the present disclosure.

FIG. 10B is a cross-section of an electronic device in accordance with some embodiments of the present disclosure. The electronic device 10B is similar to the electronic device 1 in FIG. 1, with differences therebetween as follows. Descriptions of similar components are omitted.

In some embodiments, the electronic device 10B further includes one or more connections 96 between the thermal dissipation layer 40 and the electronic component 20. In some embodiments, the connections 96 are disposed between the connections 41, 42, 43, and 44 and the electronic component 20. In some embodiments, the connections 96 may be or include conductive bumps. In some embodiments, the thermal dissipation layer 40 is connected to the electronic component 20 through one or more connections 96. In some embodiments, the connections 96 are configured to electrically connect to the conductive vias 210, 220, 230, and 240 of the electronic component 20. In some embodiments, each of the conductive vias 210, 220, 230, and 240 of the electronic component 20 is electrically connected to the thermal dissipation layer 40 through one or more connections 96. In some embodiments, the conductive via 210 is electrically connected to or bonded to the connection 41 of the thermal dissipation layer through a connection 96. In some embodiments, the conductive via 220 is electrically connected to or bonded to the connection 42 of the thermal dissipation layer through a connection 96. In some embodiments, the conductive via 230 is electrically connected to or bonded to the connection 43 of the thermal dissipation layer through a connection 96. In some embodiments, the conductive via 240 is electrically connected to or bonded to the connection 44 of the thermal dissipation layer through a connection 96. In some embodiments, the connections 96 may be or include a soldering material.

In some embodiments, the heat dissipation structure 30 may be disposed on the thermal dissipation layer 40 including the connections 41, 42, 43, and 44, and then the thermal dissipation layer 40 with the heat dissipation structure 30 formed thereon may be assembled with the electronic component 20 so as to form the electronic device 10B.

FIG. 11A, FIG. 11B, FIG. 11C, and FIG. 11D illustrate various stages of a method of manufacturing a heat dissipation structure 30 in accordance with some embodiments of the present disclosure.

Figure 11A:
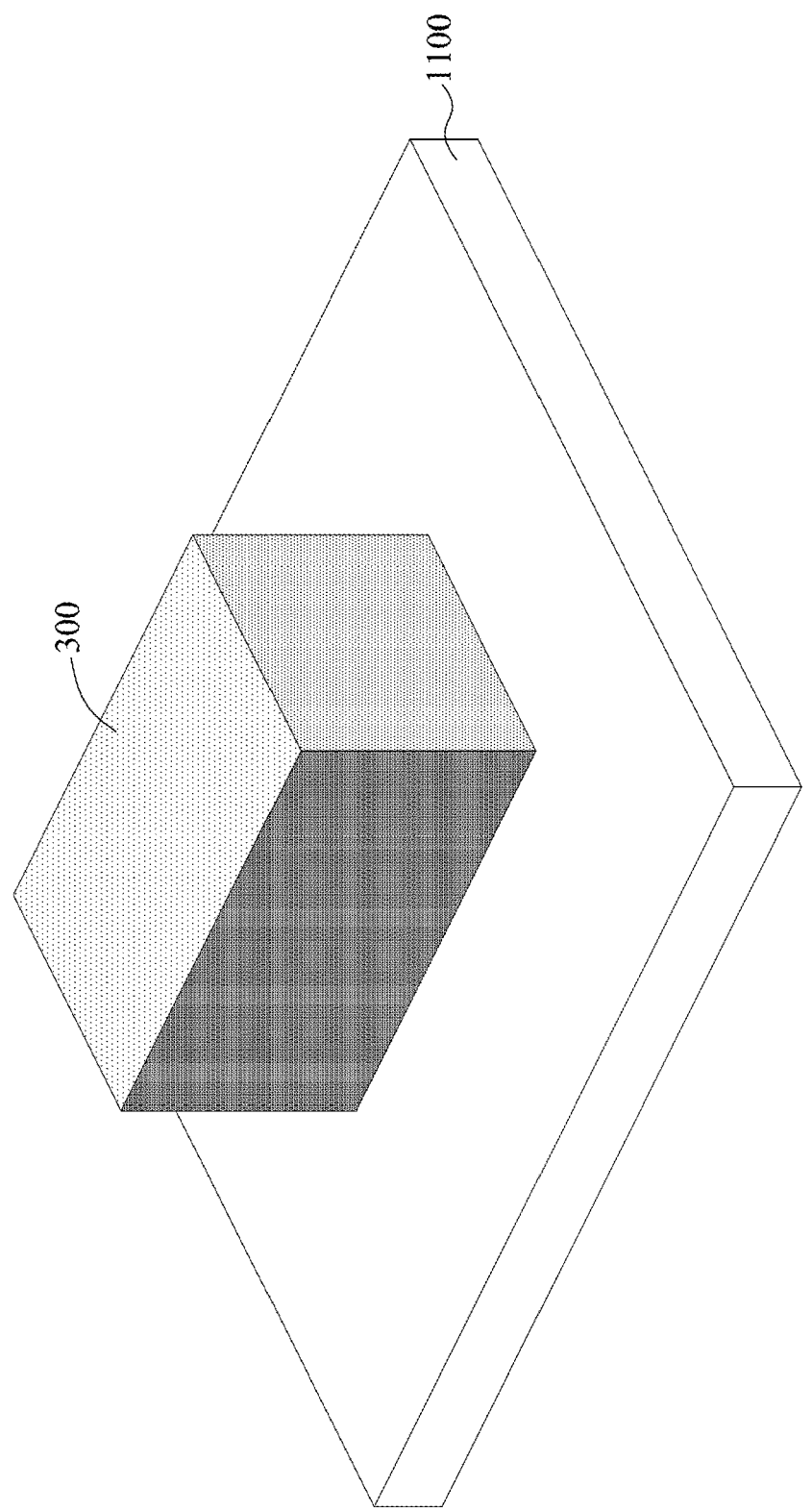
FIG. 11A, FIG. 11B, FIG. 11C, and FIG. 11D illustrate various stages of a method of manufacturing a heat dissipation structure in accordance with some embodiments of the present disclosure.

Referring to FIG. 11A, a heat dissipation structure 300 may be disposed on a carrier 1100.

Figure 11B:
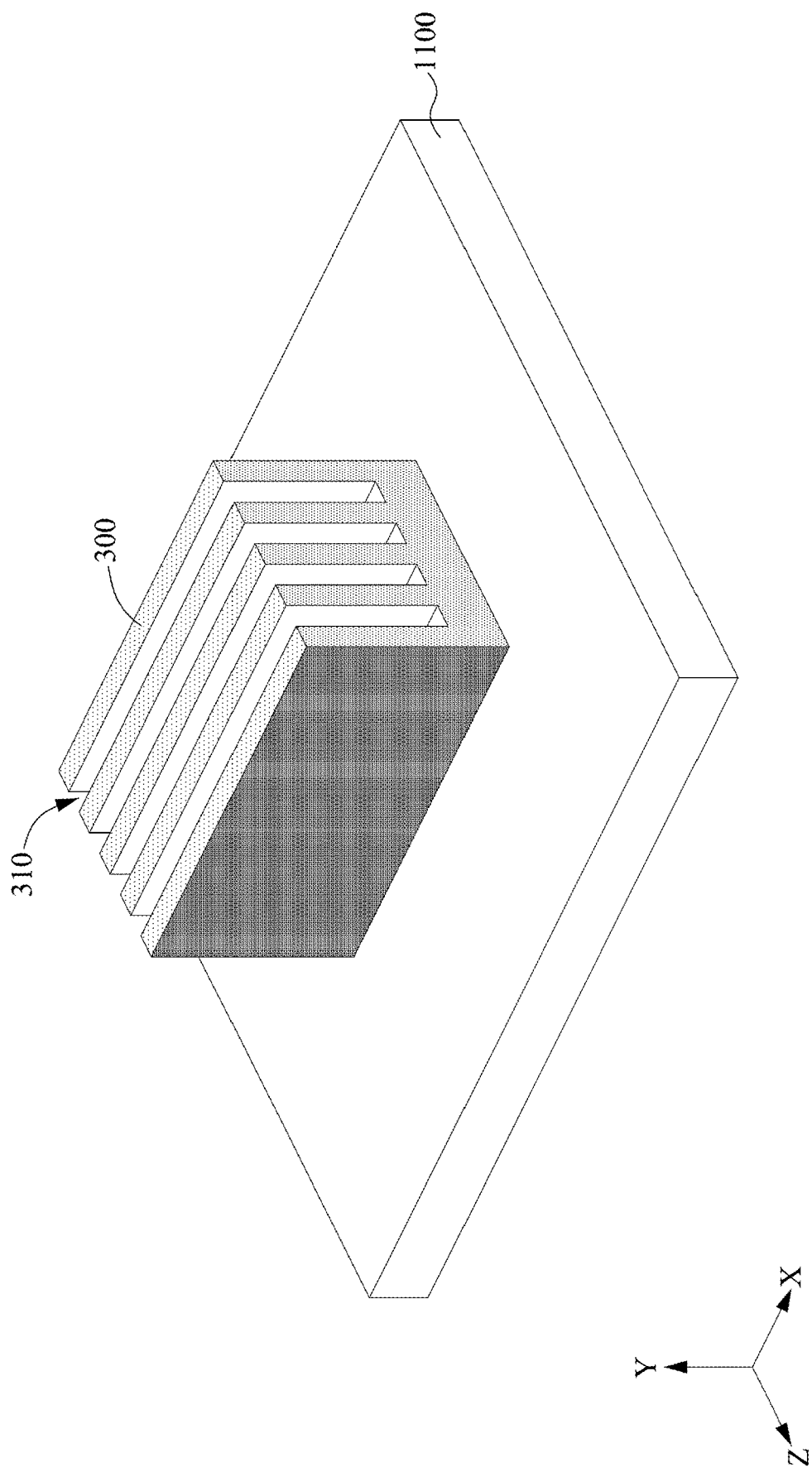

Referring to FIG. 11B, a plurality of trenches 310 may be formed in the heat dissipation structure 30. In some embodiments, the trenches 310 may be formed by etching, cutting, or any suitable operation. In some embodiments, the trenches 310 may be formed by curing the heat dissipation structure 30 into a predetermined depth but not passing therethrough. In some embodiments, the trenches 310 may be formed by disposing a mask over the heat dissipation structure 30 exposing portions where the trenches 310 to be formed and etching the heat dissipation structure 30 according to the mask. In some embodiments, the trenches 310 extend along a direction (e.g., X-axis).

Figure 11C:
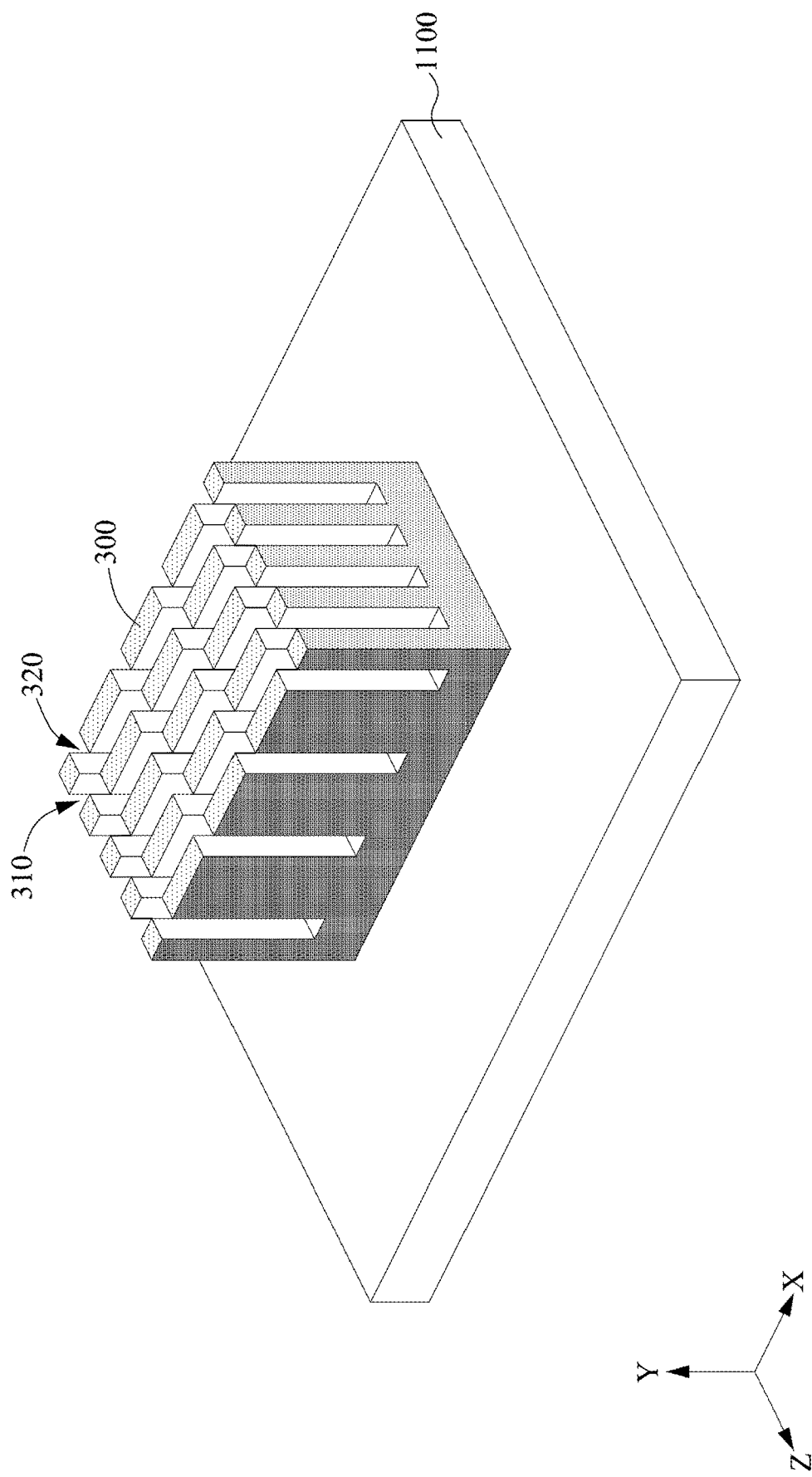

Referring to FIG. 11C, a plurality of trenches 320 may be formed in the heat dissipation structure 30. In some embodiments, the trenches 320 may be formed by etching, cutting, or any suitable operations. The trenches 320 may be formed by the same operation as the trenches 310. In some embodiments, the trenches 320 extend along a direction (e.g., Y-axis) substantially perpendicular to the direction along which the trenches 310 extend. In some embodiments, the trenches 310 cross over the trenches 320.

Figure 11D:
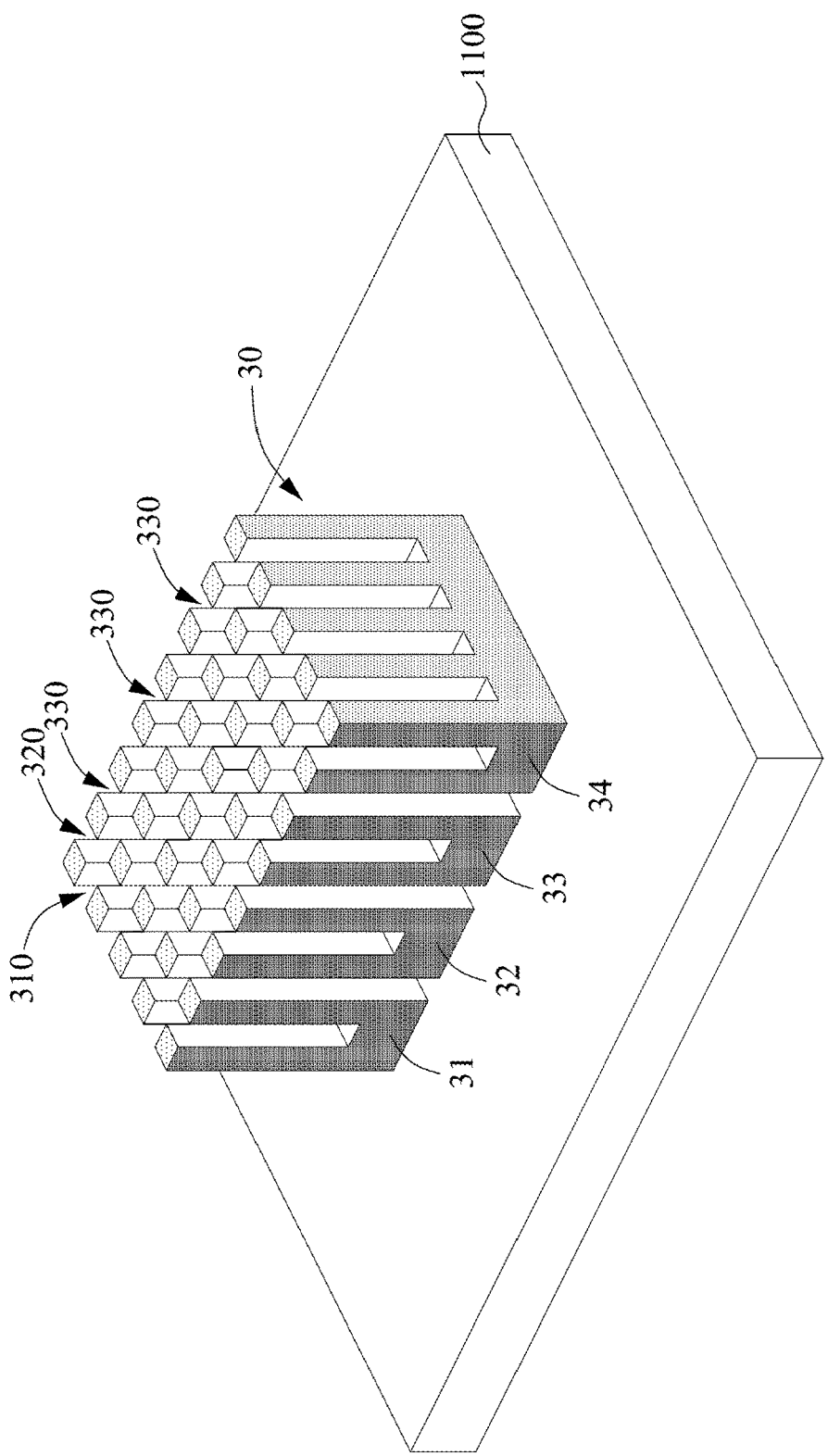

Referring to FIG. 11D, a plurality of trenches 330 may be formed passing through the heat dissipation structure 300 to form the heat dissipation structure 30 including conductive elements 31, 32, 33, and 34. In some embodiments, each of the trenches 330 is located between every two adjacent trenches 320. In some embodiments, the trenches 330 separate the conductive elements 31, 32, 33, and 34 of the heat dissipation structure 30.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of said numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component. In the description of some embodiments, a component provided "under" or "below" another component can encompass cases where the former component is directly below (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. An electronic device, comprising:
   an electronic component having a passive surface;
   a heat dissipation structure comprising a plurality of conductive elements physically separated from each other, wherein the electronic component and the respective conductive elements are configured to provide a plurality of power paths passing through the passive surface;
   a plurality of first connections disposed between the heat dissipation structure and the electronic component and configured to electrically connect the conductive elements to the electronic component; and a thermal dissipation insulating layer covering the first connections and exposing a portion of the first connections.

2. The electronic device of claim 1, further comprising a plurality of second connections disposed between the first connections and the electronic component and configured to electrically connect to a plurality of conductive vias of the electronic component.

3. The electronic device of claim 1, further comprising a connector on a side of the conductive elements and configured to electrically connect to a power supply.

4. The electronic device of claim 3, further comprising a carrier configured to support the electronic component, wherein the power supply is disposed on the carrier.

5. An electronic device, comprising:
an electronic component having a passive surface;
a heat dissipation structure disposed on the passive surface of the electronic component and configured to provide power to the electronic component; and
a power regulating component configured to receive a first power not through the heat dissipation structure and to provide a plurality of power paths between the heat dissipation structure and the power regulating component,
wherein the power regulating component is disposed over the heat dissipation structure and electrically connected to the heat dissipation structure through a plurality of conductive bumps.

6. The electronic device of claim 5, wherein the heat dissipation structure comprises a plurality of conductive elements configured to receive a plurality of powers from the power regulating component.

7. The electronic device of claim 6, wherein the power regulating component comprises a plurality of parts, and each of the parts is connected to at least two conductive elements of the plurality of conductive elements of the heat dissipation structure.

8. The electronic device of claim 5, further comprising a connector disposed on a side of the power regulating component and configured to electrically connect to an external power supply.

* * * * *